United States Patent
Bansal et al.

(10) Patent No.: US 7,346,819 B2
(45) Date of Patent: Mar. 18, 2008

(54) THROUGH-CORE SELF-TEST WITH MULTIPLE LOOPBACKS

(75) Inventors: Akash Bansal, Sunnyvale, CA (US); Michael Sobelman, Campbell, CA (US); Simon Li, Sunnyvale, CA (US); Donald A. Draper, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 186 days.

(21) Appl. No.: 10/976,549

(22) Filed: Oct. 29, 2004

(65) Prior Publication Data

US 2006/0107154 A1    May 18, 2006

(51) Int. Cl.
*G01R 31/28* (2006.01)

(52) U.S. Cl. .................. 714/726; 714/734; 714/716

(58) Field of Classification Search ................. 714/716
See application file for complete search history.

(56) References Cited

U.S. PATENT DOCUMENTS 5,630,056 A * 5/1997 Horvath et al. .............. 714/56
7,051,252 B2 * 5/2006 Smith et al. ................. 714/715
7,082,557 B2 * 7/2006 Schauer et al. ............. 714/716
2002/0040459 A1 * 4/2002 Watanabe et al. ........... 714/738
2004/0068683 A1 * 4/2004 Hoang et al. ............... 714/716

* cited by examiner

*Primary Examiner*—Cynthia Britt
(74) *Attorney, Agent, or Firm*—Shemwell Mahamedi LLP

(57) ABSTRACT

An integrated circuit device having a test sequence generator, first and second transceivers and a test sequence analyzer. The test sequence generator generates a test data sequence in response to a test mode selection. The first transceiver receives the test data sequence from the test sequence generator and is configured in a loopback mode to transmit and receive the test data sequence. The second transceiver receives the test data sequence received by the first transceiver and is configured in a loopback mode to transmit and receive the test data sequence. The test sequence analyzer determines whether the test data sequence received by the second transceiver matches the test data sequence generated by the test sequence generator.

27 Claims, 9 Drawing Sheets

THROUGH-CORE SELF-TEST WITH MULTIPLE LOOPBACKS

FIELD OF THE INVENTION

The present invention relates to the field of high-speed signaling.

BACKGROUND

Loopback tests are often used to confirm operability of transmit and receive circuits within signal transceivers. In a typical test arrangement, a pseudorandom bit sequence (PRBS) generator delivers a sequence of test data values to the transmit circuit which outputs a corresponding test signal onto a signal path. The signal path is looped-back to the input of the receive circuit which responds to the incoming test signal by generating a sequence of received data values that corresponds to the original test data sequence. The test data sequence and received data sequence are compared bit-for-bit to confirm error-free signal transmission and reception, with an error being signaled in the event of a mismatch.

While conventional loopback testing is usually sufficient for testing transceiver circuits themselves, higher level logic circuits which operate in response to specific incoming data sequences or control codes are often excluded from the loopback test path, and therefore either remain untested or require additional logic-level test circuitry to carry out further test operations.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
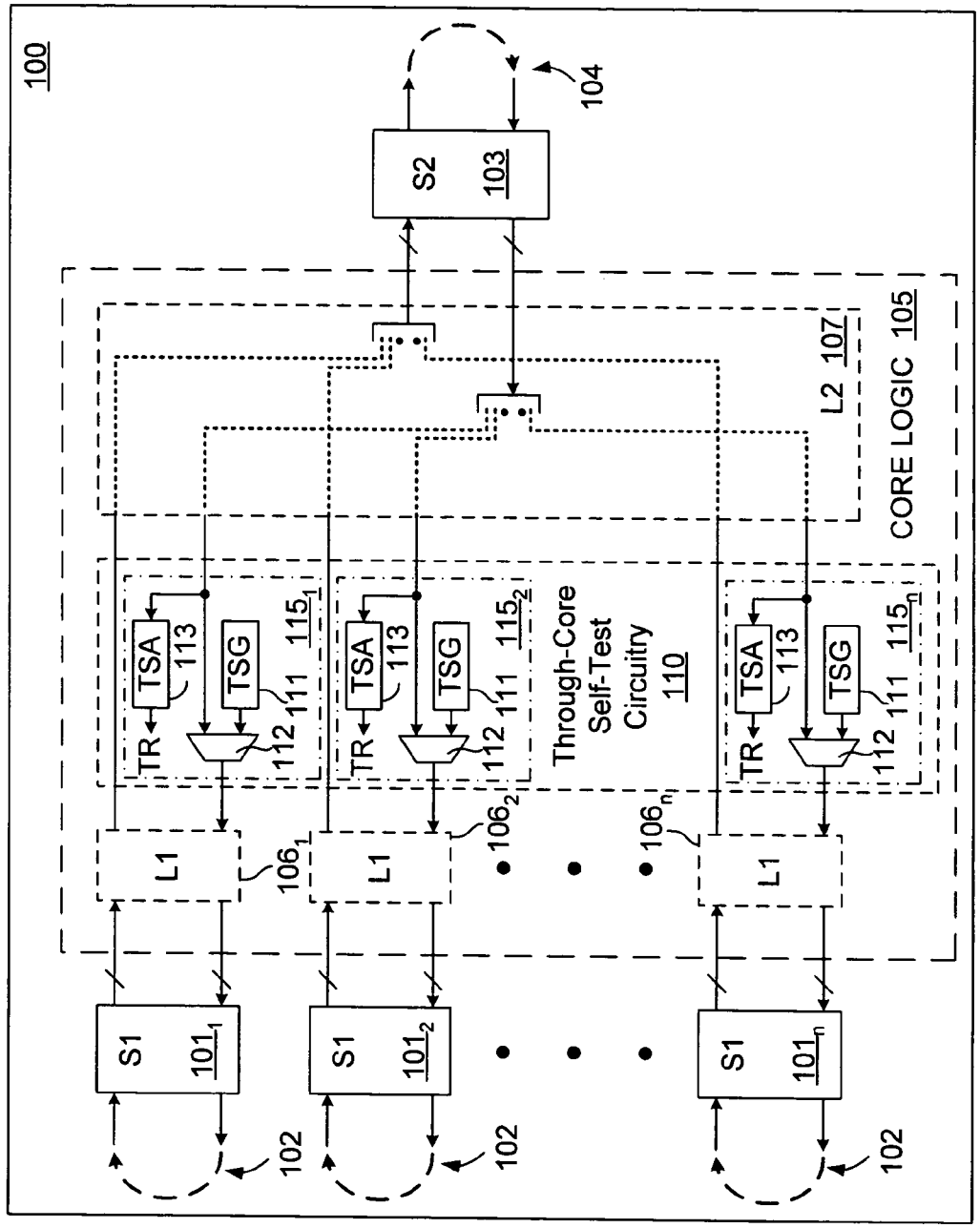
FIG. 1 illustrates a data-path device according to one embodiment.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a particular logic state (e.g., driven low or high, or to a multi-level state, or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<$\overline{\text{signalname}}$>') is also used to indicate an active low signal. The term "exemplary" is used to express but an example, and not a preference or requirement.

Signaling system components having self-test circuitry that exercises multiple transceivers, and, optionally, corresponding higher-level logic circuits, in multiple-loopback self-tests are disclosed in various embodiments. In one embodiment, for example, a test sequence generator generates a test data sequence that includes a pseudo-random sequence of data values with selected control values interspersed therein. The test data sequence is delivered from the test sequence generator to a first transceiver. The first transceiver includes an output node and input node coupled to one another by a loopback path so that, when the first transceiver transmits the test data sequence via the output node, the resulting transmission is looped back to the input node of the first transceiver where it is received to provide a first looped-back instance of the test data sequence. The first looped-back instance of the test data sequence is delivered to a second transceiver which also includes an output node and input node coupled to one another by a loopback path. Accordingly, when the second transceiver transmits the first looped-back instance of the test data sequence via its output node, the resulting transmission is looped back to the input node of the second transceiver where the transmission is received to provide a second looped-back instance of the test data sequence. The second looped-back instance of the test data sequence is delivered to a test sequence analyzer, thus providing a test data sequence that has looped through both the first and second transceivers. The test sequence analyzer compares the second looped-back instance of the test data sequence with the originally generated test data sequence to confirm error-free operation, asserting an error signal if a mismatch is detected. One or more logic circuits may be disposed in or connected to the data flow path between the test sequence generator and test sequence analyzer and therefore may be exercised by the pseudo-random sequence of data values and control values within the test data sequence. For example, in one embodiment, an encoding circuit is provided to encode the constituent values of the test data sequence prior to transmission by the first transceiver, and a corresponding decoding circuit is provided to decode the constituent values of the test data sequence received by the first transceiver. Similar encoding/decoding circuits may be provided to encode and decode the sequence of values transmitted and received by the second transceiver. In another embodiment, the first and/or second transceivers are serdes (serializing/de-serializing) transceivers that transmit constituent bits of multi-bit values as a serial stream of symbols and that reconstitute an incoming serial stream of symbols into received multi-bit values. In such an embodiment, the test sequence generator may insert control values referred to herein as framing characters into the test data sequence to exercise framing logic coupled to the data flow path from the first transceiver to the second transceiver and/or the data flow path from the second transceiver to the test sequence analyzer. The framing logic responds to the framing characters by adjusting a framing offset value as necessary to ensure that the transceiver groups the incoming stream of symbols at appropriate multi-bit boundaries. In another embodiment, the test sequence generator inserts control values referred to herein as skip characters in the test data sequence to exercise rate matching logic included in the data flow path from the first transceiver to the second transceiver and/or in the data flow path from the second transceiver to the test sequence analyzer. In yet another embodiment, the test sequence generator inserts control values referred to herein as alignment characters in the test data sequence to exercise alignment logic included in the data flow path from the first transceiver to the second transceiver and/or in the data flow path from the second transceiver to the first transceiver. In another embodiment, the test sequence generator includes a Forward Error Correcting (FEC) code in the test data sequence, the FEC code enabling detection and/or correction of single-bit or multi-bit errors in the transmitted data. The test data sequence may be checked upon final receipt and verification by circuitry in the test sequence analyzer designed to read the FEC code. In another embodiment, the test sequence generator may include a cyclic redundancy check (CRC) value in the test data sequence, the CRC value also to be verified in the test sequence analyzer. These and other embodiments are described in further detail below.

FIG. 1 illustrates a data-path device 100 according to one embodiment. In some embodiments, data-path device 100 is an integrated circuit device. The data-path device 100 includes a plurality of transceiver circuits $101_1$-$101_n$ (S1) that transmit and receive data at a first signaling rate, an arrangement of logic circuits and test circuitry referred to collectively herein as core logic 105, and a transceiver circuit 103 (S2) that transmits and receives data at a second signaling rate. In one application, data-path device 100 is mounted to a line card within a network router (or switch or other transmission routing device) and used to forward data between the router's input/output (I/O) ports and switch fabric. In such an application, the transceiver circuits 101 are coupled to I/O ports of the router (e.g., directly or via optical-electrical signal converters, wireless transceivers or other intermediary circuitry) and are therefore referred to herein as port-side transceivers, while the transceiver circuit 103 S2 is coupled to switch fabric or other control circuitry within the router (e.g., via a backplane) and is therefore referred to herein as a control-side transceiver. This naming convention is used throughout the following description, though the data-path device 100 may be used in virtually any application in which data forwarding between transceivers 101 and transceiver 103 is desired.

In one embodiment, the data-path device 100 is implemented in a dedicated integrated circuit (IC) package such that the input and output nodes of the port-side transceivers 101 and the control-side transceiver 103 are coupled to I/O structures (e.g., pins, balls, or other interconnection structures) of the IC package. In an alternative embodiment, the data-path device 100 may be included with other circuitry in an integrated circuit device (e.g., a system-on-chip or other highly integrated device) with one or more of the transceivers 101 and/or 103 coupled to other circuit blocks within the integrated circuit device via conductive-layer interconnects (e.g., metal layer interconnects) or with all the transceivers 101 and 103 coupled to external devices. In other embodiments, the data-path device 100 may be implemented in a discrete integrated circuit die that is packaged together with one or more other integrated circuit dice to form a multi-chip package (e.g., a multi-chip module, paper-thin package, etc.). In such a package, the data-path device 100 may be one of multiple data-path devices that each are coupled to respective package I/O structures and/or one or more of the transceivers 101 and 103 or other circuits within the data-path device 100 may be coupled to another integrated circuit die within the multi-chip package.

Still referring to FIG. 1, each of the transceiver circuits 101 and 103 are configurable in a loopback arrangement for testing purposes, the loopback paths (102, 104) being formed, alternatively by connecting a removable loopback cable between the input and output nodes of a given transceiver, or by switchably coupling the input and output nodes of the transceiver via an internal loopback path. The loopback paths, or any one of them, may also be formed by switchably coupling the input and output nodes of a remote transceiver such that the loopback path traverses one or more electrical, fiber-optic or wireless links within a signaling network to enable full-path testing.

The core logic circuit 105 includes a set of port-side logic circuits $106_1$-$106_n$ (L1), through-core self-test circuitry 110 and control-side logic circuitry 107 (L2). In one embodiment, the through-core self-test circuitry 110 comprises a set of channel self-test circuits $115_1$-$115_n$, each used to test a given data channel (i.e., data path between a respective one of transceivers 101 and transceiver 103) within the data-path device 100. Referring to channel test circuit $115_1$, for example, a test sequence generator 111 is provided to generate a sequence of test data values which, when a self-test mode is selected within the data-path device 100, is output via multiplexer 112 to the port-side logic circuit $106_1$ and then to port-side transceiver $101_1$ (in normal operating mode, the multiplexer 112 passes the output of the control-side logic circuit 107 to the port-side logic circuit 106₁ for normal data flow). When the self-test mode is selected, loopback path 102 is switchably established between transmit and receive circuits of the port-side transceiver 101₁ (or formed by a cable interconnect as discussed above) so that the port-side transceiver 101₁ both transmits and receives a test signal that corresponds to the sequence of test data values, and forwards the received test data sequence (i.e., a sequence of samples of the test signal) to the port-side logic circuit 106₁. The port-side logic circuit 106₁ may perform any number of functions in response to the test data sequence delivered by transceiver 101₁ (including changing the format of the constituent values of the test data sequence through encoding or decoding operations) before forwarding the received test data sequence to the control-side logic circuit 107. The control-side logic circuit 107 may likewise perform any number of functions in response to the incoming test data sequence before delivering the test data sequence, together with test data sequences received in the other data channels, to the control-side transceiver 103. In one embodiment, the control-side transceiver 103 operates at a signaling rate that is a multiple of the signaling rates of the port-side transceivers 101 and therefore may transmit all the test data sequences delivered by the control-side logic 107 in the same (or less) time than required for any one of the port-side transceivers 101 to receive a given one of the test data sequences. More specifically, in one embodiment, the signaling rate of the control-side transceiver is 'n' times the signaling rate of the individual port-side transceivers, where 'n' is the ratio of port-side transceivers 101 to control-side transceivers 103. By this arrangement, the data-path device 100 performs a signal concentrating and de-concentrating function, transmitting each of the data sequences received on the port-side transceivers 101₁-101ₙ in time multiplexed fashion onto loopback path 104, and de-multiplexing data sequence received on the control-side transceiver 103 into n data sequences to be delivered via respective data channels to the port-side transceivers 101₁-101ₙ. In the embodiment depicted in FIG. 1, each port-side transceiver 101 transmits and receives data at the same rate as the others of the port-side transceivers, though the transmit data rate and receive data rate need not be equal. In alterative embodiments, the transmit and/or receive data rates of one or more of the port-side transceivers 101₁-101ₙ may differ from others of the port-side transceivers. Also, when signaling rates of the port-side transceivers 101₁-101ₙ are different from one another, the signaling rate of the control-side transceiver 103 may be configured to have a signaling rate that is a function of the various signaling rates of the port-side transceivers 101.

When the self-test mode is selected, the loopback path 104 is switchably established between transmit and receive circuits of the control-side transceiver 103 (or formed by a cable interconnect as discussed above) so that the control-side transceiver 103 both transmits and receives a test data signal that corresponds to the test data sequences forwarded by the control-side logic circuit 107, generating a concentrated set of test data sequences (i.e., samples of the test data signal recovered by the control-side transceiver) that are returned to the control-side logic circuit 107 for distribution to respective data channels. Referring to the first data channel (i.e., the data channel formed, in part, by transceiver 101₁ and port-side logic circuit 106₁), the test data sequence received by the control-side transceiver 103 and forwarded by the control-side logic circuit 107 to the channel self-test circuit 115₁ represents the result of a complete round-trip passage of the originally generated test data sequence (i.e., generated by the test sequence generator 111) through the core logic 105, port-side transceiver 101₁ and control-side transceiver 103 of the data-path device 100; a path referred to herein as a through-core test path. Thus, by comparing the control-logic-forwarded test data sequence to the originally generated test data sequence in a test sequence analyzer 113, proper operation of the entire data channel within the data-path device 100, including the core logic 105, may be confirmed in a single self-test. In one embodiment, the channel self-test circuits 115₁-115ₙ for each of the data channels within the data-path device are operated simultaneously to perform such through-core self-tests, with each of the test sequence analyzers 113 within the self-test circuits 115₁-115ₙ outputting respective test result signals (TR). The test result signals may be combined (e.g., in a logic OR gate, for example when a logic '1' test result indicates failure, or other combinatorial logic) to generate a final pass/fail signal that indicates the overall test result and/or the test result signals may each be supplied to a host device (e.g., output directly or in response to a status request). As discussed below, if a self-test failure is detected on one or more data channels, further self-testing may be performed to isolate the failure to a specific transceiver or core logic circuit within the data-path device 100.

It should be noted that while a single control-side transceiver 103 is illustrated in FIG. 1, multiple control-side transceivers 103 may be provided in alternative embodiments, each control-side transceiver 103 corresponding to a respective set of port-side transceivers 101. For example, in one embodiment, two 12.5-Gigabit per second (Gbs) control-side transceivers 103 are provided in the data-path-device 100, each to support four 3.125 Gbs port-side transceivers 101. Other numbers of control-side transceivers and port-side transceivers operating at other signaling rates may be provided in alternative embodiments.

Figure 2:
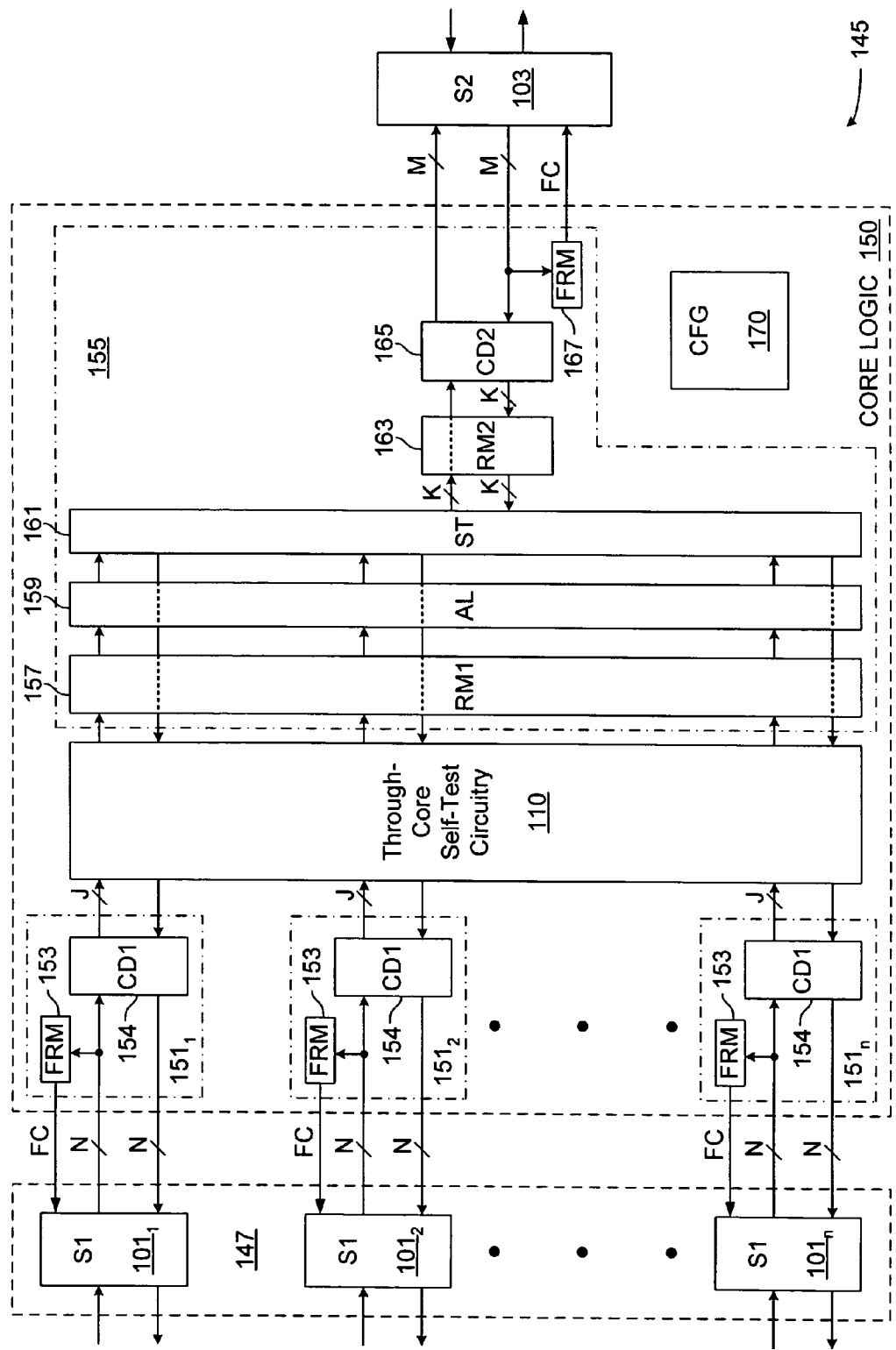
FIG. 2 illustrates a data-path device according to another embodiment.

FIG. 2 illustrates a data-path device 145 according to another embodiment, showing an exemplary set of logic functions that may be performed within the port-side and control-side logic circuits. The data-path device 145 includes a port-side transceiver bank 147 having 'n' port-side transceivers 101₁-101ₙ, port-side logic circuits 151₁-151ₙ, through-core self-test circuitry 110, control-side logic circuit 155, control-side transceiver 103 and a configuration circuit 170. In the embodiment shown, each of the port-side transceivers 101 is a serdes transceiver that transmits and receives data over respective unidirectional point-to-point links. In alternative embodiments, each port-side transceiver 101 may transmit and receive data over a single bi-directional link, and each link, whether bi-directional or unidirectional may alternatively be a multi-drop signal path. Also, each link, whether bi-directional or unidirectional may include a pair of signal conductors to convey differential signals that are transmitted in voltage or current signaling modes, or a single signal conductor to carry a single-ended signal in voltage or current signaling modes. Common-mode signaling over conductor pairs may also be used instead of or in addition to differential signals. For example, in one embodiment, common-mode signaling is carried out simultaneously with differential signaling over one or more differential links to establish a backchannel communication path for communication of link control settings or other information. Further, instead of a single signal path per transceiver, each port-side transceiver 101 may be coupled to multiple signal paths to enable transmission and reception of parallel groups of bits (e.g., no serializing and/or deserializing operation being necessary). Also, clocking information may be embedded in the data transmission (e.g., in data state transitions) or provided on dedicated or otherwise separate transmission paths.

In the embodiment of FIG. 2, the transmit circuit within each port-side transceiver 101 receives a sequence of N-bit transmit data values from a corresponding port-side logic circuit 151 and transmits each data value as a serial stream of symbols, each symbol being transmitted in response to a transition of a transmit clock signal. The receive circuit within each port-side transceiver performs the converse function of sampling an incoming symbol stream in response to transitions of a sampling clock signal to generate a plurality of bits that are grouped into N-bit receive data values and forwarded to the corresponding port-side logic circuit 151. In one embodiment, for example, the transmit circuit is a binary transmitter that transmits each N-bit data value as a stream of N binary symbols in response to transitions of one or more transmit clock signals, and the receive circuit is a binary receiver that samples an incoming stream of binary symbols in response to transitions of one or more sampling clock signals. In an alternative embodiment, the transmit circuit may be a multi-level transmitter that transmits each N-bit data value as a stream of symbols that convey more than a single bit (e.g., quaternary symbols that convey two bits each, octal symbols that convey three bits each, etc.) and the receive circuit is a counter-part multi-level receiver that samples each incoming multi-bit symbol to generate a corresponding multi-bit sample value. In other embodiments, the transceiver may operate alternately in binary and multi-level signaling modes, dynamically switching between signaling modes in response to signaling conditions (e.g., detecting a threshold bit error rate, bandwidth demand etc.) or statically operating in a given signaling mode in response to a configuration setting. With regard to transmit and receive data rates, the transceiver may operate as a double data-rate transceiver (i.e., the transceiver's data rate multiplier is 2), transmitting and/or receiving a pair of symbols in even and odd phases of transmit and sampling clock signals (e.g., transmitting in response to rising edges of a transmit clock signal and complement transmit clock signal and, similarly, receiving in response to rising edges of a sampling clock signal and complement sampling clock signal) or, by extension, as quad data-rate transceiver, octal data-rate transceiver, decade (×10) data-rate transceiver or a transceiver having an odd-numbered data rate multiplier or any other data rate multiplier.

In the embodiment of FIG. 2, each of the port-side transceivers 101 includes a clock-data recovery (CDR) circuit that iteratively adjusts the phase of the sampling clock signal (or multiple sampling clock signals in the case of a multi-data-rate implementation) based on transitions in the incoming data signal. For example, the CDR circuit may detect signal transitions that correspond to edges of data eyes (i.e., edges of data valid intervals) and adjust the phase of the sampling clock signal to align the sampling clock transitions with the nominal midpoint between the edges (i.e., to sample the incoming data signal at nominal midpoints of the data eyes). To ensure sufficient transition density in the incoming data signal, the transmitted data values may be encoded prior to transmission and decoded after reception. In the embodiment of FIG. 2, for example, an encoding scheme is applied to ensure sufficient transition density for CDR operation (e.g., converting each of $2^J$ possible J-bit patterns into a respective one of $2^N$ possible N-bit patterns, with each of the N-bit patterns exhibiting a desired number of '1' to '0' transitions). Other encoding schemes may be used in alternative embodiments, or other types of signaling may be used to ensure sufficient transition density in the incoming signal (e.g., Manchester encoded signaling). In other embodiments, CDR circuitry may be omitted so that encoding for transition density is unnecessary.

In the embodiment of FIG. 2, the control-side transceiver 103 receives a sequence of M-bit transmit data values (each composed of 'n' N-bit data values) and transmits each data value as a serial stream of symbols, each symbol being transmitted in response to a transition of a transmit clock signal. The receive circuit within the control-side transceiver 103 performs the converse function of sampling the incoming symbol stream in response to transitions of a sampling clock signal to generate a plurality of bits that are grouped into M-bit receive data values. As with the port-side transceivers 101, the control-side transceiver 103 may transmit and receive data at any practicable data rate, may include CDR circuitry for recovering a sampling clock signal from the incoming symbol stream, and may be a binary transceiver or multi-level transceiver. In one embodiment, for example, each of four port-side transceivers is a 2-PAM (i.e., binary; each symbol having one of two pulse amplitude modulation levels), double-data-rate serdes transceiver that transmits and receives data at 3.125 Gbs, and the control-side transceiver is a 4-PAM (i.e., each symbol having one of four different pulse amplitude modulation levels), quad-data-rate transceiver that transmits and receives data at 12.5 Gbs. Other combinations of signaling rates and symbol encoding (i.e., 2-PAM, 4-PAM, etc.) may be used in alternative embodiments. Also, the signal path or paths coupled to the control-side transceiver 103 may be unidirectional or bi-directional, and differential or single-ended. Further, port-side transceivers 101 and/or control-side transceiver 103 may be multi-modal in that they may be self-configured or otherwise configured to operate using various modulation techniques, data rates, signaling schemes, etc.

The particular logic circuits included within the core logic 150 of FIG. 2 correspond to the structure and signaling protocol of the port-side and control-side transceivers. For example, in one embodiment, each of the port-side logic circuits 151 includes a framing circuit 153 (FRM) to group serially received symbols into N-bit data words, and a codec 154 (i.e., coder/decoder, CD1) to implement an encoding/decoding function. The control-side logic circuit 155 similarly includes a framing circuit 167 (FRM) to group serially received symbols into M-bit data words and a codec 165 (CD2) to implement an encoding/decoding function on subsets of N bits within the M-bit data words. The control-side logic circuit 155 further includes rate matching circuits 157 and 163 (RM1 and RM2), alignment circuit 159 (AL) and steering circuit 161 (ST). Embodiments of the rate matching, alignment and steering circuits are described below as are embodiments of the control-side and port-side framing circuits and codecs. Any number of additional and/or different logic circuits may be included in alternative embodiments.

Still referring to FIG. 2, configuration circuit 170 is used to store one or more configuration values that may be used to control various operating modes and parameters within the data-path device 145. For example, in one embodiment, the configuration circuit 170 includes respective bit fields for controlling the signaling rates and symbol encoding levels in the port-side transceivers 101 and/or control-side transceiver 103; for controlling the type of encoding/decoding to be applied by the port-side and/or control-side codecs (154 and 165); and for controlling operation of the rate matching circuits 157, 163, alignment circuit 159 and/or steering circuit 161. The configuration circuit 170 may also include a test mode field that is programmed with one of a number of different values to switch the operating mode of the data-path device 145 from a normal operating mode to one of a number of different test modes. As discussed below, the configuration circuit 170 may also be used to select a redundant data channel or portion thereof (e.g., a transceiver 101 and/or corresponding logic circuits within core logic 150) to operate in place of a defective or out-of-tolerance data channel. The configuration circuit 170 may be implemented, for example, by a volatile or non-volatile storage circuit that is run-time programmable (e.g., by a host device such as a network processor, general-purpose processor, application specific integrated circuit (ASIC) or other control device) and/or production-time programmable (e.g., by production test apparatus).

Still referring to FIG. 2, the through-core self-test circuitry is disposed between the codecs 154 of the port-side logic circuits 151 and the rate matching circuit 157 and is used to perform transceiver loopback tests and logic loopback tests that exercise the various functions of the core logic circuit 150 and the port-side and control-side transceivers 101, 103. In alternative embodiments, the through-core self-test circuitry may be disposed elsewhere in the paths between the port-side transceivers 101 and the control-side transceiver 103.

Figure 3:
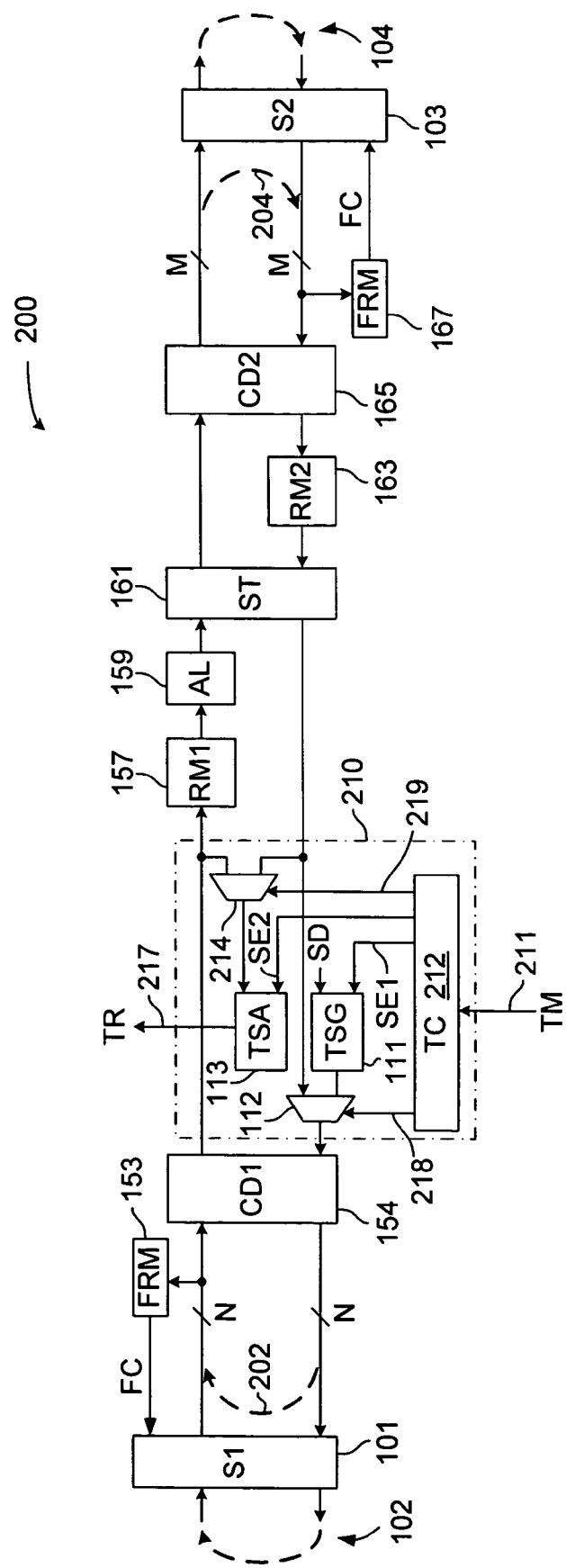
FIG. 3 illustrates an embodiment of a single data channel that may be implemented within the data-path device of FIG. 2.

FIG. 3 illustrates an embodiment of a single data channel 200 that may be implemented within a data-path device, such as for example, the data path device 145 of FIG. 2. As shown, the data channel 200 includes a channel self-test circuit 210, codec 154, framing circuit 153, port-side transceiver 101, rate matching circuit 157, alignment circuit 159, steering circuit 161, rate matching circuit 163, codec 165, framing circuit 167 and control-side transceiver 103. It should be noted that the control-side transceiver 103, framing circuit 167 and codec 165 may be shared by (i.e., constitute part of) multiple data channels. For clarity of explanation, the port-side transceiver 101 is described in embodiments below as being one of four port-side transceivers that exchange data with control-side transceiver 103. Also, codecs 154 and 165 are described as including 8b/10b encoder/decoder circuits so that 10-bit data words are delivered in succession to (and received in succession from) the port-side transceiver 101 (i.e., N=10) and groups of four 10-bit data words (i.e., 40-bit words such that M=40) are delivered in succession to (and received in succession from) the control-side transceiver 103. As discussed above, other encoding/decoding schemes (including omission of codes 154 and 165 where no encoding/decoding is required), word sizes and port-side-to-control-side transceiver ratios may be used in alternative embodiments. Also, any one or more of the core logic elements may be omitted from the data channel 200 in alternative embodiments.

Still referring to FIG. 3, the channel self-test circuit 210 includes a test controller 212 (TC), test sequence generator 111 (TSG), test sequence analyzer 113 (TSA), and multiplexers 112 and 214. When a through-core loopback test mode is indicated by test mode signal 211 (TM), the test controller 212 outputs seed-enable signals (SE1 and SE2) to the test sequence generator 111 and test sequence analyzer 113, and outputs select signals 218 and 219 to multiplexers 112 and 214 to form a through-core test path in the data channel 200. More specifically, multiplexer 112 responds to select signal 218 by passing the output of the test sequence generator 111 to the codec 154, and multiplexer 214 responds to select signal 219 by passing- the output of steering circuit 161 to the test sequence analyzer 113.

In one embodiment, seed enable signal, SE1, is used to enable a seed value to be loaded into a pseudo-random bit sequence generator within the test sequence generator 111, and is deasserted after the seed value is loaded. Thereafter, the test sequence generator 111 outputs a pseudo random bit sequence in the form of successive 8-bit test values, the test values being referred to herein as a pseudo-random data sequence. As discussed below, the test sequence generator 111 may additionally include circuitry to generate 8-bit control characters that are used to exercise the framing circuits 153 and 167, rate matching circuits 161 and 163 and alignment circuit 159, inserting the control characters within the pseudo-random data sequence at regular or random intervals. In the embodiment of FIG. 3, the test sequence generator 111 outputs a control bit along with each data value of the outgoing test data sequence, the control bit being high to indicate that the corresponding 8-bit value is a control character, and low to indicate that the corresponding 8-bit value is part of a pseudo random data sequence. Thus, the codec 154 receives a sequence of 9-bit values (i.e., 8-bit value and control bit) from the test sequence generator 111 via multiplexer 112 and performs an encoding operation in accordance with the state of the control bit to generate a corresponding sequence of 10-bit values. That is, if the control bit indicates that the corresponding 8-bit value is part of a pseudo random data sequence, the codec 154 encodes the 8-bit value into a 10-bit value having one of a number of predetermined in-band bit patterns within the 10-bit code space. If the control bit indicates that the corresponding 8-bit value is a control character, the codec 154 encodes the control character to a predetermined 10-bit pattern not otherwise included in the in-band bit patterns (i.e., an out-of-band bit pattern that identifies the particular control character to be transmitted). The sequence of 9-bit data values supplied to the codec 154 is referred to herein as an unencoded test data sequence (although the test data sequence may be viewed as the 8-bit values only) and the corresponding sequence of 10-bit values generated by the codec are referred to herein as an encoded test data sequence. The unencoded test data sequence and corresponding encoded test data sequence may be viewed as the same test data sequence in different formats.

Still referring to FIG. 3, if the test mode signal 211 indicates a through-core loopback test, then the encoded test data sequence is supplied from the codec 154 to the port-side transceiver 101 which, in turn, outputs a corresponding test signal onto loopback path 102. As discussed above, the loopback path may be established within the data-path device (e.g., through a switchable pass-gate connection between the transceiver output and input nodes), or through an external loopback connection (e.g., a cable). In either case, the receive circuit within the port-side transceiver 101 receives the test signal and generates a sequence of 10-bit values that nominally matches the encoded test data sequence output from codec 154, and that is referred to herein as an encoded, once-transceived (1T) test data sequence.

The encoded 1T test data sequence is supplied to the framing circuit 153 and to the decoding input of the codec 154. The framing circuit 153 searches pairs of data values within the encoded 1T test data sequence to identify bit patterns therein that correspond to framing characters and, upon detecting a framing character, outputs an updated frame control (FC) signal to the port-side transceiver 101. The codec 154 decodes the encoded 1T test data sequence to recover a sequence of 9-bit values (i.e., an unencoded 1T test sequence having constituent 8-bit test values and corresponding control bits) which is forwarded to rate matching circuit 157. In the embodiment of FIG. 3, the unencoded 1T test sequence is optionally provided, via multiplexer 214, to the test sequence analyzer 113 to enable a single-ended loopback test. As discussed below, the single-ended loopback test may be selected by the test mode signal 211 (the test controller 212 controlling the operation of multiplexer 214 accordingly) to isolate errors detected during the more extensive through-core loopback test.

Continuing with the progression of the unencoded 1T test sequence through the data channel 200, the rate matching circuit 157 selectively inserts and deletes skip characters within the unencoded 1T test sequence as necessary to compensate for a frequency difference between data transmission and reception clocks (e.g., where a transmitting device and the data-path device that includes the data channel 200 have a plesiochronous timing relationship), then forwards the unencoded 1T test sequence to the alignment circuit 159. The alignment circuit 159 selectively delays progression of the unencoded 1T test sequence as necessary to achieve synchronicity between alignment characters in each of the different data channels 200 within the data-path device, then forwards the unencoded 1T test sequence to the steering circuit 161. The steering circuit 161 steers the unencoded 1T test data sequence to a selective one of four encoding inputs within the control-side codec 165 which, in turn, encodes the unencoded 1T test data sequence (along with unencoded 1T test data sequences received from the steering circuit for the other three data channels 200) into a sequence of 40-bit test values. As discussed above, more or fewer data channels may be provided per control-side transceiver, and different data sizes may be used so that the sequence of test values generated by the codec 165 may have more or fewer bits in alternative embodiments.

If the test mode signal 211 indicates a through-core loopback test, then the encoded test data sequence output from codec 165 is supplied to the control-side transceiver 103 which, in response, outputs a corresponding test signal onto loopback path 104. As with the port-side loopback path 102, the loopback path 104 may be established within the data-path device (e.g., through a switchable connection between the output and input nodes of transceiver 103), or through an external loopback connection (e.g., a cable). In either case, the receive circuit within the control-side transceiver 103 receives the test signal and generates a sequence of test values that nominally matches the encoded test data sequence output from codec 165, the sequence of test values being referred to herein as an encoded, twice-transceived (2T) test data sequence.

The encoded 2T test data sequence is supplied to the framing circuit 167 and to the decoding input of the codec 165. The framing circuit 167 operates in generally the same manner as framing circuit 153, searching the encoded 2T test data sequence to identify bit patterns therein that correspond to framing characters and, upon detecting a framing character, outputting an updated frame control signal (FC) to the control-side transceiver 103. The codec decodes the encoded 2T test data sequence to recover a respective sequence of 9-bit values (i.e., an unencoded 2T test data sequence having constituent 8-bit test values and corresponding control bits) for each of the data channels 200 associated with the control-side transceiver. Each of the unencoded 2T test sequences is forwarded to rate matching circuit 163 which operates generally in the same manner as the rate matching circuit 157 to insert and remove skip characters within the incoming 2T test sequences as necessary to compensate for a transmit/receive frequency difference. The rate matching circuit 163 forwards the unencoded 2T test sequences to the steering circuit 161 which delivers each of the unencoded 2T test sequences to the channel self-test circuit 210 for a respective one of the data channels 200.

When the unencoded 2T test sequence is initially received within the channel self-test circuit 210, the seed-enable signal (SE2) provided to the test sequence analyzer 113 is still asserted, and the unencoded 2T test sequence is therefore provided, via multiplexer 214, as a seed data pattern to the test sequence analyzer 113. By this operation, a pseudo-random bit sequence generator within the test sequence analyzer 113 is seeded with nominally the same data (i.e., assuming that no errors have occurred) as the test sequence generator 111. After a period of time sufficient to ensure that the test sequence analyzer 113 has been properly seeded, seed enable signal SE2 is deasserted, and the test sequence analyzer 113 begins self-generating nominally the same test sequence as the unencoded 2T test sequence arriving via multiplexer 214. Thus, by providing comparison circuitry within the test sequence analyzer 113 to compare the self-generated test sequence and the unencoded 2T test sequence, the test sequence analyzer 113 may determine whether the two test sequences match and thereby determine whether the unencoded 2T test data sequence has been successfully looped back through the port-side and control-side transceivers and successfully passed through various core logic stages. If a mismatch is detected, the test sequence analyzer 113 may raise a test result signal 217 (TR) to signal the error. As discussed above, the test result signal 217 may be combined with test result signals from channel self-test circuits 210 for other data channels within the data-path device to form a device-level test result signal.

Still referring to FIG. 3, in addition to the through-core loopback test described above, the test mode signal 211 may instruct the channel self-test circuit 210 to carry out a single-ended loopback test, and one or more internal transceiver-bypass tests. These additional tests may be useful, for example, to isolate errors detected during through-core loopback testing to a particular transceiver or logic circuit. When the single-ended loopback test is selected, the unencoded 1T test sequence output from the codec 154 is provided directly to the test sequence analyzer 113 via multiplexer 214. The codec 154 and framing circuit 153 may also be bypassed (e.g., depending on the state of the test mode signal 211) to achieve a dedicated test of the port-side transceiver 101. Thus, the single-ended loopback test may be used to confirm the operation of the port-side transceiver 101, codec 154 and, if appropriate framing characters are included in the test data sequence, the framing circuit 153. Accordingly, if a failure is detected in the through-core loopback test, the single-ended loopback test may be executed to narrow the source of failure to either the port-side transceiver 101 (and port-side logic) or the control-side transceiver 103 and control-side logic.

In a transceiver-bypass test, the port-side transceiver 101 and/or control-side transceiver 103 is bypassed, the test sequence instead being routed from codec output to input as shown by paths 202 and 204 (or either one of paths 202 and 204). Thus, if an error has been isolated to either the port-side transceiver/port-side logic or in the control-side transceiver/control-side logic, the transceiver bypass test may be executed to narrow the source of failure to either the transceiver or logic in either side of the data channel 200. As discussed above, if the failure is narrowed to a given data channel 200 (e.g., port-side transceiver or port-side logic or control-side logic that is limited to a single data channel), a redundant (i.e., backup) data channel may be selected to operate in place of the failed data channel, with multiplexers disposed in the data flow path to bypass the failed channel (or component thereof) and pass data to and from the redundant data channel instead.

Referring to FIGS. 2 and 3, it should be noted that a number of changes may be made within the data channel 200 and the data-path device 145 in alternative embodiments. For example, any of the core logic elements (e.g., codec 154, framing circuit 153, rate matching circuit 157, alignment circuit 159, steering circuit 161, rate matching circuit 163, codec 165 and/or framing circuit 167) may be omitted in whole or part. Also, any of the core logic elements or subsets thereof may be selectively bypassed during through-core or internal loopback tests, for example, to enable further isolation of failures detected during more comprehensive tests. Further, while a particular test data flow direction has been described (i.e., out of test circuit 210 toward the port-side transceiver and then back toward the control-side transceiver) different flow directions may be used in alternative embodiments. Also, while the test sequence generator and test sequence analyzer have been described as being disposed between the port-side codec and port-side rate matching circuit (i.e., elements 154 and 157 of FIG. 3), the test sequence generator and test sequence analyzer may alternatively be disposed between other core logic elements including, without limitation, between control-side logic elements. For example, in one embodiment, the test sequence generator and test sequence analyzer are disposed between the control-side codec 165 and control-side rate matching circuit 163 of FIG. 3. In such an embodiment, only one self-test circuit 210 is required per N data channels, with the test sequence generator outputting, for example, a multi-channel test sequence that includes N component test sequences each to be routed to a respective one of N data channels 200 by the steering logic 161. The multi-channel test sequence may include alignment characters disposed at desired intervals to establish control-side framing and to exercise the control-side framing and steering logic.

It should also be noted that the loopback tests and transceiver bypass tests described in reference to FIG. 3 may be used for purposes other than pass/fail testing. For example, in one embodiment, the above described through-core loopback testing may be used for component binning. That is, clock frequencies may be incrementally increased for each device under test to identify fail points, with the tested devices being qualified for execution at one of multiple different frequencies according to the test results. Similar testing may be used to qualify devices for operation at different voltages and/or temperatures.

Figure 4:
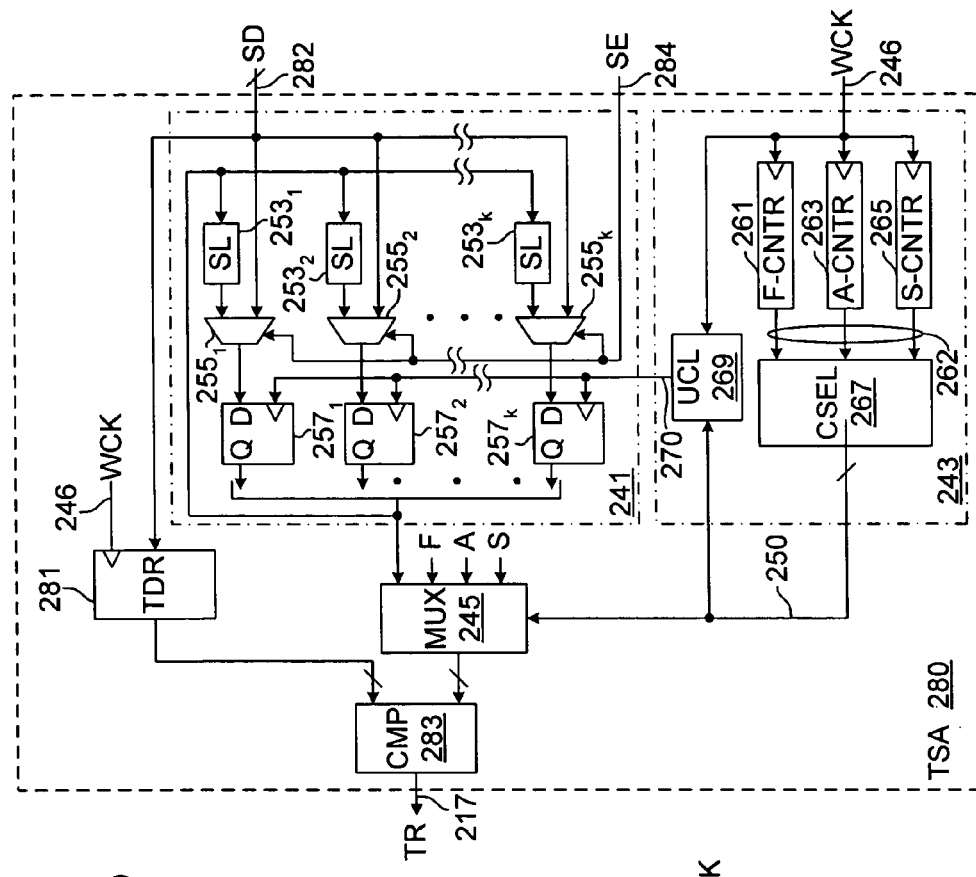
FIG. 4 illustrates an embodiment of a test sequence generator that may be used within a data-path device according to one embodiment.

FIG. 4 illustrates an embodiment of a test sequence generator 240 that may be used within the data-path devices described above in reference to FIGS. 1-3. The test sequence generator 240 includes a pseudo-random bit sequence generator 241, control character insertion circuit 243 and multiplexer 245. In the particular embodiment shown, the pseudo-random bit sequence generator 241 is a parallelized linear-feedback shift register (LFSR) and includes a set of storage elements $257_1$-$257_k$ (flip-flops in the embodiment shown), multiplexers $255_1$-$255_k$ and summing logic circuits $253_1$-$253_k$ (SL). When a seed enable signal 244 is asserted, the multiplexers 255 select respective bits of a seed data value 242 (SD) to be loaded into the storage elements 257, thereby establishing a desired initial condition within the pseudo-random bit sequence generator 241. After the initial condition is established, the seed enable signal 244 is deasserted so that the multiplexers 255 pass the outputs of summing logic circuits $253_1$-$253_k$ to be loaded into storage elements $257_1$-$257_k$, respectively, at each rising edge (or falling edge) of an update signal 270. Each of the summing logic circuits 253 is used to sum outputs of selected storage elements 257 to generate the next-cycle output for the corresponding storage element 257. The selected storage element outputs that are summed within a given summing logic circuit may be fixed to achieve a desired LFSR polynomial, or a polynomial select code (not shown) may be provided to the pseudo-random bit sequence generator 241 (e.g., a code programmed within the configuration circuit 170 of FIG. 2) to enable different LFSR polynomials to be selected according to application needs or within different channel self-test circuits. The output of the pseudorandom bit sequence generator 241 is provided to a first input of multiplexer 245, with other inputs of the multiplexer 245 coupled to receive a framing character (F), alignment character (A) and skip character (S), respectively. Additional and/or different control characters may be provided to the multiplexer 245 in alternative embodiments.

The control character insertion circuit 243 generates a select signal 250 that is used to select either the output of the pseudo-random-bit sequence generator 241 or one of the control characters (e.g., F, A, S) to be output by multiplexer 245 as the next value in a sequence of test data values. In the particular embodiment of FIG. 4, the control character insertion circuit 243 includes a framing counter 261, alignment counter 263, skip counter 265, character select circuit 267 (CSEL) and update control logic 269. Each of the counters 261, 263 and 265 is incremented (or decremented) in response to a word clock signal (WCK) 246 (e.g., an instance of the sampling clock signal used within the port-side transceiver divided by N, the number of bits per parallel word provided to and output from the port-side transceiver) until a predetermined terminal count is reached, at which point the counter outputs a corresponding one of terminal count signals 262 to the character select circuit, then resets at the next WCK edge to a predetermined start count. The character select circuit 267 responds to a terminal count assertion by a given counter (261, 263, 265) by outputting an appropriate select signal 250 to enable the multiplexer 245 to select the control character that corresponds to the terminal-count-asserting counter to be output as the next value in the test data sequence. By this arrangement, each of the counters 261, 263, 265 may be programmed with start count values (and/or terminal count values) to achieve a desired frequency of the corresponding control character in the test data sequence. When none of the terminal count signals from counters 261, 263, 265 is asserted, the character select circuit 267 outputs the select signal 250 in a default state to enable the multiplexer 245 to pass the output of the pseudorandom bit sequence generator 241 as the next value in the test sequence. In one embodiment, each selectable control character is a 9-bit value formed by a predetermined 8-bit bit pattern and a logic '1' control bit. When the select signal 250 is in the default state, a logic low control bit is passed by the multiplexer 245 along with an 8-bit output from the pseudorandom bit sequence generator 241. Other numbers of bits and other techniques for establishing the state of the control bit may be used in alternative embodiments.

In the embodiment of FIG. 4, whenever a control character is selected to be inserted into the test data sequence (i.e., selected to be passed by multiplexer 245), the state of the pseudorandom bit sequence generator is held steady (i.e., not changed). In the particular embodiment shown, such hold-operation is achieved by the update control logic 269 which passes the word clock signal 246 to the strobe inputs of storage elements 257 (i.e., as update signal 270) unless the select signal 250 indicates a control character insertion. Alternatively, the storage elements 257 may have enable inputs coupled to receive the select signal 250 (i.e., preventing change of state, when the select signal 250 is asserted), or may be loadable storage elements (e.g., output selectively coupled to input, for example via a multiplexer) which maintain their state when the select signal 250 is asserted. In an alternative embodiment, the word clock signal 246 may be provided directly to the strobe inputs of storage elements 257 (i.e., instead of being gated by the update control logic 269) so that the pseudorandom bit sequence generator is not halted during control character insertion.

It should be noted that numerous changes may be made to the test sequence generator 240 of FIG. 4. For example, virtually any circuit capable of generating random or pseudorandom sequences of test data values may be used in place of the pseudorandom bit sequence generator 241, and any number of additional and/or different control characters may be inserted into the test sequence by the control character insertion circuit 243. Also, test sequence generators which output non-random bit patterns, including static bit patterns and algorithmically generated bit patterns (e.g., a memory test pattern such as a checkerboard pattern, or a walking pattern in which a logic '1' or '0' bit is progressively shifted through a sequence of bit positions) may be used in alternative embodiments in place of the test sequence generator of FIG. 4 or other test sequence generators referenced below. Further, instead of providing programmable counters 261, 263, 265 to insert control characters at regular intervals, randomizing circuitry may be provided to insert control characters of any or all types at random (or pseudorandom) intervals. Also, the test sequence generator may additionally include error checking information within the test data sequence to enable detection and/or correction of single-bit or multi-bit errors in the transmitted data. In one embodiment, for example, the test sequence generator generates a Forward Error Correcting (FEC) code based on the test data sequence, and appends, embeds or otherwise includes the FEC code in the test data sequence. The FEC code may be used within the test sequence analyzer or other components of the data-path device to detect and/or correct single-bit or multi-bit errors in the transmitted data. For example, the test data sequence may be checked upon final receipt and verification by circuitry in the test sequence analyzer designed to read the FEC code. In another embodiment, the test sequence generator may include a cyclic redundancy check (CRC) value in the test data sequence instead of or in addition to the FEC code. The CRC value also be verified in the test sequence analyzer and/or used by other components of the data-path device.

Figure 5:
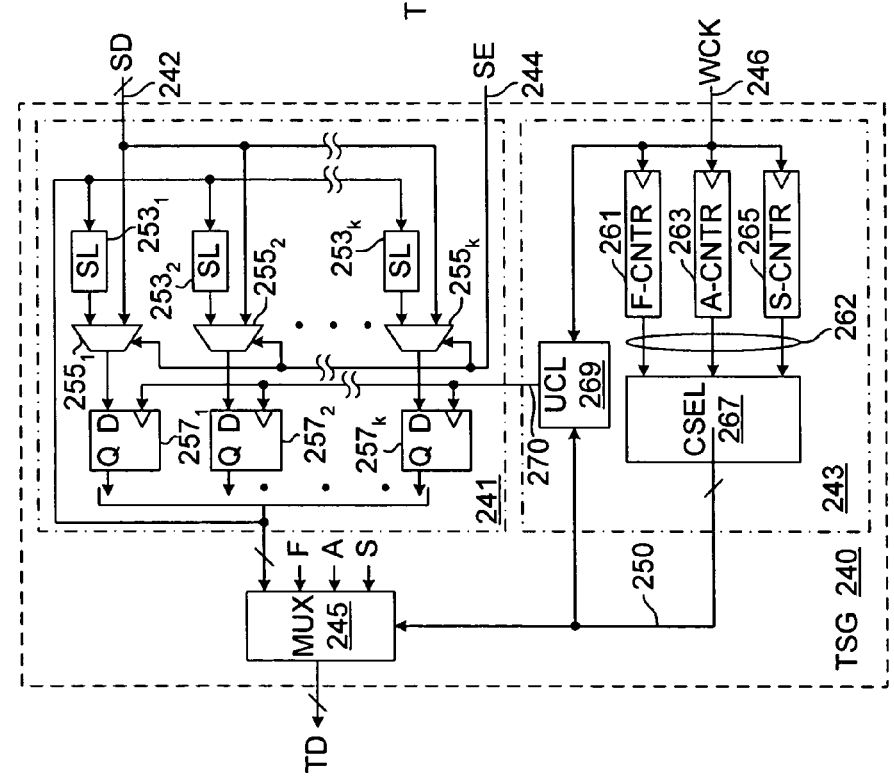
FIG. 5 illustrates a test sequence analyzer that may be used within a data-path device in conjunction with a test sequence generator such as, for example, the test sequence generator of FIG. 4.

FIG. 5 illustrates a test sequence analyzer 280 that may be used within a channel self-test circuit in conjunction with the test sequence generator 240 of FIG. 4. The test sequence analyzer 280 includes a pseudo-random bit sequence generator 241, control character insertion circuit 243, and multiplexer 245 all of which operate generally as described in reference to FIG. 4 (and which may be implemented in any of the alternatives mentioned in connection therewith), and additionally includes a test data register 281 and comparator 283. A seed enable signal 284 is initially asserted to enable a sequence of seed data values 282 to be loaded directly into the storage elements 257 of the pseudorandom bit sequence generator 241. The seed data input of the test sequence analyzer 280 may be coupled via a multiplexer (e.g., multiplexer 214 of FIG. 3) to receive a test data sequence (e.g., either an unencoded T1 test sequence or an unencoded T2 test sequence, depending on the selected test mode) and therefore is eventually seeded with test data generated by the test sequence generator 240. The seed data input is additionally coupled to the test data register 281 which is loaded with one test data value after another in response to the word clock signal 246. The output of the test data register 281 is provided to the comparator 283 along with the output of the multiplexer 245 so that, while the test sequence generator is being seeded, the comparator 283 receives identical values (i.e., the sequence of seed data values 282) and therefore detects no mismatch conditions and does not assert test result signal 217 (i.e., thereby indicating that no failure is detected). In one embodiment, synchronizing circuitry (not shown in FIG. 5) monitors the control bit in the incoming test data sequence (i.e., in the data received via the seed data input) while the seed enable signal 284 is asserted to determine whether a control character is present at the seed data input. If a control character is present (e.g., indicated by a logic '1' control bit), the synchronizing circuitry forces the counter for the indicated control character (i.e., one of counters 261, 263 or 265) to the terminal count value so that the update control logic will prevent the pseudorandom bit sequence generator from loading the control character and so that the multiplexer 245 will output a control character during the same word clock cycle that the control character is stored in (and output from) the test data register 281, thereby preventing the comparator 283 from detecting a mismatch. By this operation, after at least one control character of each type has been received, the control character counters 261, 263 and 265 are set to generate control characters in synchronism with receipt of control characters in the incoming test data sequence. That is, the control character insertion circuit 243 is synchronized with the counterpart control character insertion circuit 243 within the test sequence generator 240 of FIG. 4.

Still referring to FIG. 5, after the pseudorandom bit sequence generator 241 has been seeded with test data generated by the test sequence generator and the control character insertion circuit has been synchronized with its counterpart in the test sequence generator, the seed enable signal 284 is deasserted to enable testing. At this point, the pseudorandom bit sequence generator 241 within the test sequence analyzer 280 self-generates a sequence of test data values that should, absent signaling or logic errors within the data channel under test, match the test data sequence presented at the seed data input. Also, as the control character counters are synchronized to match control character instances within the incoming test data sequence, the control character counters 261, 263 and 265 should signal selection of control characters (i.e., by asserting terminal count signals 262) at times that correspond to receipt of control characters in the incoming test data sequence. Thus, absent signaling errors or logic errors within the data channel under test, the comparator 283 should receive matching values from the test data register 281 and the multiplexer 245 during each cycle of the word clock signal 246. If a mismatch is detected, the comparator asserts the test result signal 217 to signal an error.

As with the test sequence generator, numerous changes may be made to the test sequence analyzer 280 in alternative embodiments. For example, virtually any circuit capable of generating random or pseudorandom sequences of test data values, or static or algorithmically generated data patterns, may be used in place of the pseudorandom bit sequence generator 241, and any number of additional and/or different control characters may be inserted into the test sequence by the control character insertion circuit 243. Further, instead of providing programmable counters to insert control characters at regular intervals, randomizing circuitry may be provided to insert control characters of any or all types at pseudorandom intervals that are synchronized pseudorandom character insertion intervals established within the test sequence generator. Also in other embodiments, the test sequence generator of FIG. 4 (or an alternate embodiment thereof) may output the test data sequence directly to the test sequence analyzer 280 for comparison with the test data sequence received at the seed data input. In such an embodiment, the test analyzer 280 may be simplified to include the comparator 283 for comparing the direct-received and looped-back test data sequences and buffering circuitry to delay the direct-received test data sequence (i.e., the test data sequence delivered directly from the test sequence generator to the test sequence analyzer 280) as necessary to achieve synchronism with the looped-back test data sequence. Further, in another embodiment, the test sequence generator of FIG. 4 and the test sequence analyzer 280 may each be seeded by a common seed signal provided at their respective seed data inputs (242, 282). After the test sequence generator and test sequence analyzer have each been seeded with identical data, the test sequence generator may proceed to output a test data sequence while the test sequence analyzer is prevented from changing state until arrival of the looped-back test data sequence.

Figure 6:
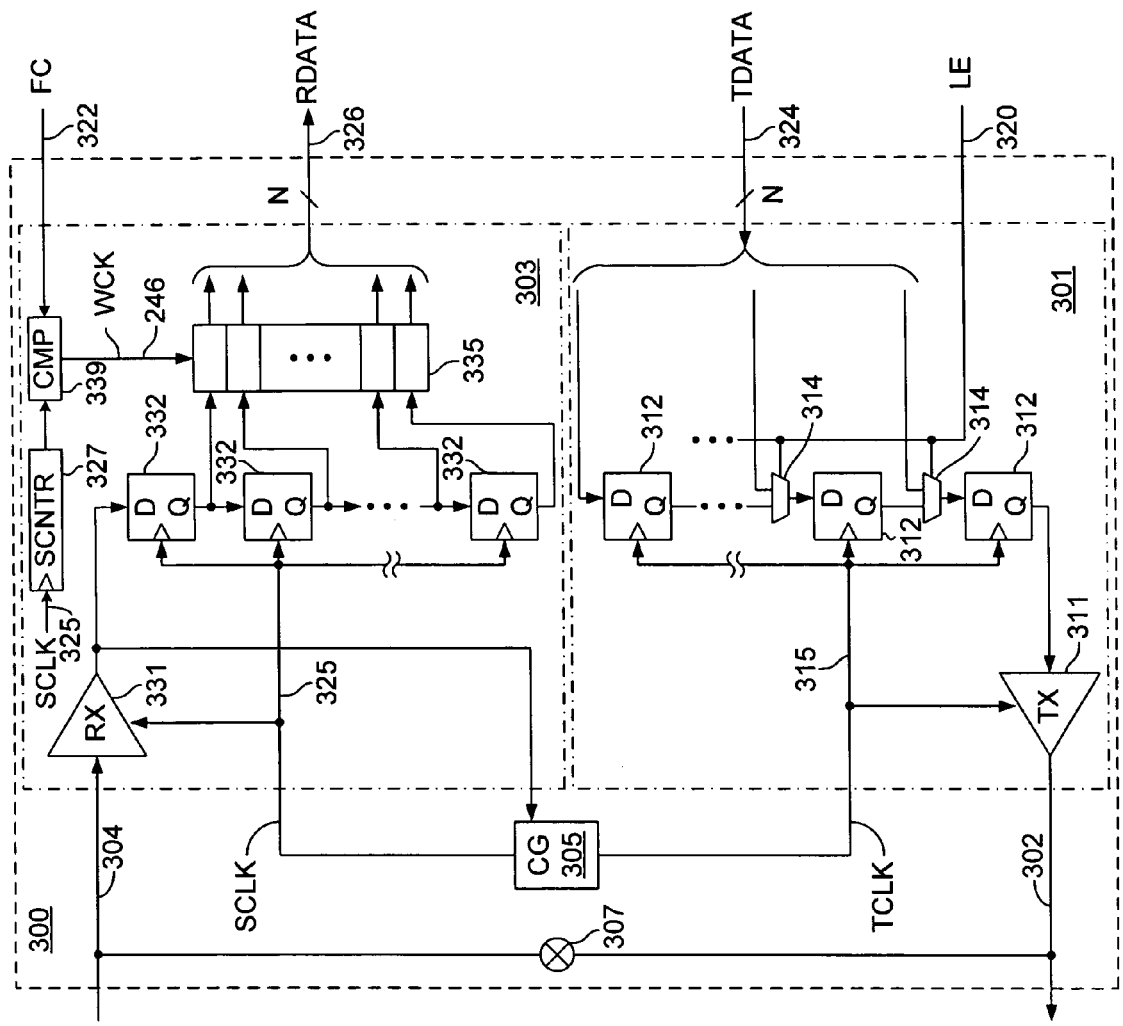
FIG. 6 illustrates an embodiment of a transceiver that may be used to implement the port-side and/or control-side transceivers of FIGS. 1-3.

FIG. 6 illustrates an embodiment of a transceiver 300 that may be used to implement the port-side and/or control-side transceivers of FIGS. 1-3. The transceiver 300 includes a transmit circuit 301 (RX), receive circuit 303, clock generator 305 and loopback switch 307. The transmit circuit 301 includes an output driver 311, and loadable shift register formed by storage elements 312 and multiplexers 314. When a load enable signal 320 (LE) is asserted, a transmit data value 324 (TDATA) is transferred in parallel into the shift register storage elements 312 via multiplexers 314. Thereafter, the load enable signal is deasserted to enable the contents of the shift register to be shifted one by one (i.e., via the alternate paths through multiplexers 314) to the output driver 311 in response to a transmit clock signal 315 (TCLK). In the embodiment of FIG. 6, the output driver 311 transmits one bit at a time on output node 302 in response to transitions of the transmit clock signal 315. As discussed above, the output driver 311 may alternatively generate a multi-level output signal and thus transmit two or more bits in each outgoing symbol. Also, the transmit clock signal 315 may include a number of constituent clock signals that are phase offset as necessary to achieve a desired transmit data rate. Further, for proper setup and hold purposes, the clock signal (or clock signals) used to shift the contents of storage elements 312 to the output driver 311 may be phase-offset relative to the transmit clock signal 315.

The receive circuit 303 includes a sampling circuit 331, a shift circuit formed by storage elements 332, an output register 335, a sample counter 327 and a frame comparator 339. The sampling circuit 331 may be a binary or multi-level sampling circuit and generates a sequence of sample values by sampling the stream of symbols arriving at input node 304 in response to transitions of a sampling clock signal 325. The sample values, which may be single or multi-bit values, depending on the nature of sampled symbols, are shifted one after another into the shift register storage elements 332 in response to the sampling clock signal 325 or a clock signal (or clock signals) having a predetermined phase relationship to the sampling clock signal 325. When a word clock signal 246 (WCK) is asserted, the contents of the shift register storage elements 332 are transferred in parallel to the output register 335 where they are output as a received data value 326 (RDATA). As with the transmit clock signal 315, the sampling clock signal 325 may include multiple constituent clock signals that are phase-distributed to enable multi-data rate sampling operation within the sampler 331. Also, the sampling clock signal 325 may include one or more edge clock signals that are used to sample the signal arriving at input node 304 at edges of data eyes. As discussed below, the edge samples may be provided directly to a CDR circuit within the clock generator 305 to enable proper data-to-clock phase alignment between the incoming signal and the sampling clock signal 325. Note that the transmit clock signal 315 may be related to the sampling clock signal (e.g., generated by a common phase-locked loop, delay-locked loop or other timing source) or may be independently generated.

Still referring to FIG. 6, the sample counter 327 (SCNTR) is a modulo N counter that counts transitions of the sampling clock signal for purposes of framing the incoming received data values on N-bit boundaries. In the exemplary embodiment of FIG. 6, the sample counter output (i.e., the sample count) is compared with a frame control value 322 (FC) generated by a framing circuit (e.g., element 153 or 167 of FIGS. 2 and 3). In one embodiment, the frame control value 322 is a count value that indicates an offset into the sample count at which incoming data is to be framed. Thus, when the sample count reaches a value that matches the frame control value, the framing comparator 339 asserts the word clock signal 246 to transfer the contents of the shift register into output register 335. By this arrangement, the framing circuit may adjust the frame control value 322 to reflect the offset at which a framing character occurs within the incoming symbol stream so that received data values are output thereafter on the desired N-bit framing boundary.

Still referring to FIG. 6, the clock generator 305 is provided to generate the transmit clock signal 315, sampling clock signal 325 and any other clock signals that may be needed for transceiver operation or to time other functions within the data-path device. In one embodiment, the clock generator 305 includes a reference loop for generating a set of phase vectors that are phase-distributed through the cycle time of the sampling clock signal 325, and also includes one or more interpolators for mixing selected pairs of the phase vectors to generate the sampling clock signal 325 and clock signals that are phase offset from the sampling clock signal (e.g., edge clock signals). The clock generator may further include a CDR circuit for detecting the early/late status of the sampling clock signal relative to a desired sampling instant (e.g., based on samples of data-state transitions captured in response to edge clock transitions) and for adjusting the sampling clock phase accordingly. The reference loop may include a ring oscillator or any other circuit for self-generation of a reference clock signal, or may receive an externally generated reference clock signal. In either case, the reference loop may include a phase-locked loop (e.g., to multiply the frequency of the reference clock signal) and/or delay-locked loop for generating the phase vectors that are mixed to form the final sampling clock signal 325. The transmit clock signal 315 may be a free running clock signal (e.g., one of the phase vectors generated by the reference loop) or may be a phase-adjusted signal having a controlled offset relative to the sampling clock signal 325 or other clock signal.

Still referring to FIG. 6, the loopback switch 307 is used to establish an on-chip, switchable loopback path between output node 302 and input node 304. The loopback switch 307 may be implemented, for example, by a pass gate (e.g., switched between open and closed states according to the state of the test mode signal 211 of FIG. 3 or another control signal)) or any other circuit for looping the output of output driver 311 back to the input of sampling circuit 331. The transceiver 300 may thus be configured in a loopback arrangement either by closing loopback switch 307 or by coupling an external path between output node 302 and input node 304, in both cases enabling signals generated by output driver 311 to be looped back to the input of sampling circuit 331.

Figure 7:
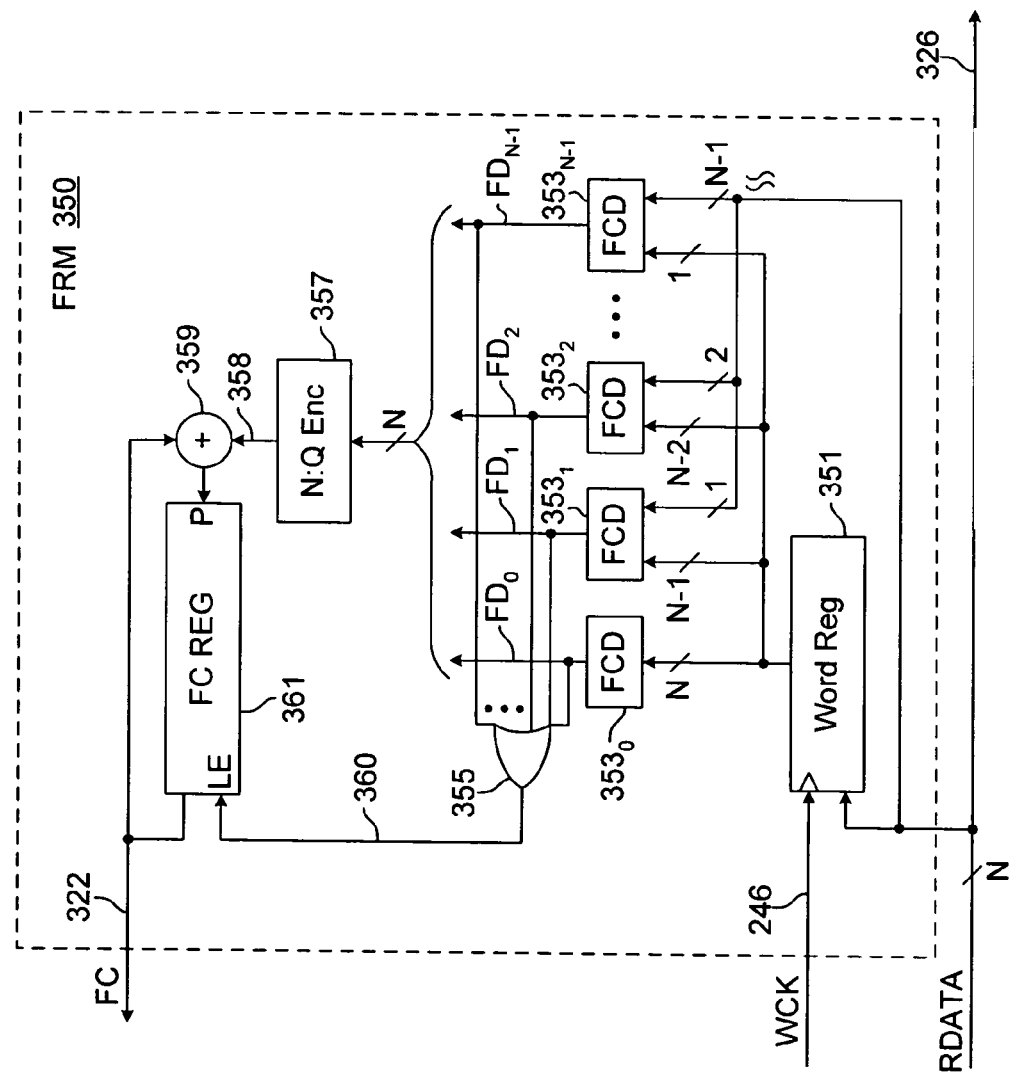
FIG. 7 illustrates a framing circuit according to one embodiment.

FIG. 7 illustrates a framing circuit 350 according to one embodiment. The framing circuit 350 includes a word register 351, frame control register 361, summing circuit 359, encoder 357, OR gate 355 and a set of frame character detect circuits $353_0$-$353_{N-1}$. The word register 351 is loaded with the N-bit received data value 326 from a transceiver output register in response to the word clock signal 246, simultaneously (or substantially simultaneously) with the reloading of the transceiver output register with a successive receive data value. Thus, the content of the word register 351 and the updated received data value 326 collectively constitute 2N bits of received data which may be inspected by the frame character detect circuits 353 to determine whether a frame control character has been received. In the embodiment of FIG. 7, each of the frame character detect (FCD) circuits $353_0$-$353_{N-1}$ is coupled to receive an N-bit value having a progressively higher frame offset within the 2N bits of data. More specifically, FCD circuit $353_0$ is coupled to receive the N-bit output of the word register 351 itself and asserts a frame detect signal ($FD_0$); FCD circuit $353_1$ is coupled to receive the least latent N−1 bits from the word register 351 and the most latent (i.e., first received) bit of received data value 326; FCD circuit $353_2$ is coupled to receive the least latent N−2 bits from the word register 351 and the most latent two bits of received data value 326; and so forth to FCD circuit $353_{N-1}$ which is coupled to receive the least latent bit from the word register 351 and the most latent N−1 bits of receive data word 326. If any of the frame character detect circuits 353 determines that its input set of N bits matches a framing character, the frame character detect circuit asserts a frame detect signal (FD). Thus, if a framing character is present at a given offset (0 to N−1) within the 2N set of bits formed by the output of word register 351 and received data value 326, the frame detect circuit 353 that receives N-bits starting at the offset will assert its frame detect signal FD, thereby signaling that a frame character has been detected and the offset of the frame character relative to the transition of the word clock signal 246. The frame detect signals $FD_0$-$FD_{N-1}$ are supplied to OR gate 355 and to an N:Q encoder 357. The encoder 357 encodes the frame detect signals $FD_0$-$FD_{N-1}$ to generate an offset value 358 that ranges from 0 to N−1 according to which of the frame character detect circuits 353, if any, asserts a frame detect signal. In one embodiment, for example, the encoder 357 outputs an offset value 'i' if frame character detect circuit $353_i$ asserts a frame detect signal (i.e., 'i' ranging from 0 to N−1). The offset value 358 generated by the encoder 357 represents the offset of the framing character relative to the current framing control value 322 maintained within the frame control register 361. Accordingly, in the embodiment of FIG. 7, the offset value 358 is added to the current framing control value 322 in summing circuit 359 and the summed result (i.e., updated frame offset) provided to a parallel load port (P) of the frame control register 361. If a frame detect signal is asserted, the OR gate 355 drives a load enable signal 360 high to enable the updated frame offset to be loaded into the frame control register 361 as the new frame control value.

It should be noted that numerous changes and additions may be made to the framing circuit of FIG. 7 in alternative embodiments. For example, control circuitry may be provided ensure glitchless update to the phase of the word clock signal when the frame control value is changed. More generally, any circuitry that may detect the presence of framing characters in the incoming sequence of data values, and establish a corresponding updated framing boundary may be used in place of the framing circuit 350.

Figure 8:
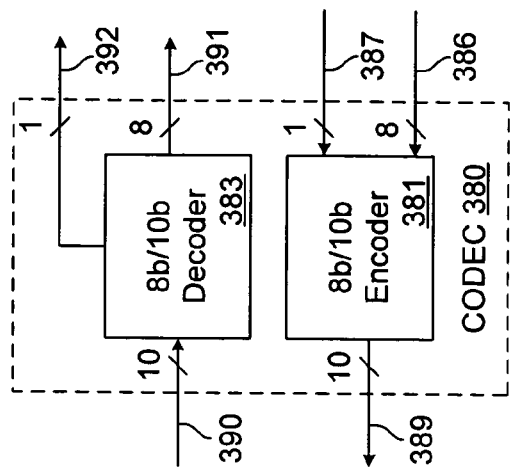
FIG. 8 illustrates an embodiment of a codec that may be used to implement the port-side codecs and/or the control-side codec.

FIG. 8 illustrates an embodiment of a codec 380 that may be used to implement the port-side codecs 154 and/or the control-side codec 165 illustrated in FIGS. 2 and 3. In the particular embodiment shown, the codec 380 includes an 8b/10b encoder that converts an 8-bit data value 386 and corresponding control bit 387 into a 10-bit encoded value 389. The codec further includes an 8b/10b decoder 383 that performs the inverse function of encoder 381, generating a decoded 8-bit value 391 based on the bit pattern of an incoming 10-bit value 390, and, if the input value 390 is an out-of-band value (i.e., not a valid 8b/10b code), asserting an out-of-band signal 392. Numerous alternative codec circuits may be used instead of codec 380 in alternative embodiments including codec circuits that receive and/or generate values having different numbers of constituent bits. Where encoding is performed to ensure CDR-enabling transition density, virtually any encoding scheme that will yield the desired transition density may be used. Also, in alternative embodiments (e.g., in a mesochronous system or a DC coupled system), codecs may be omitted altogether.

Figure 9:
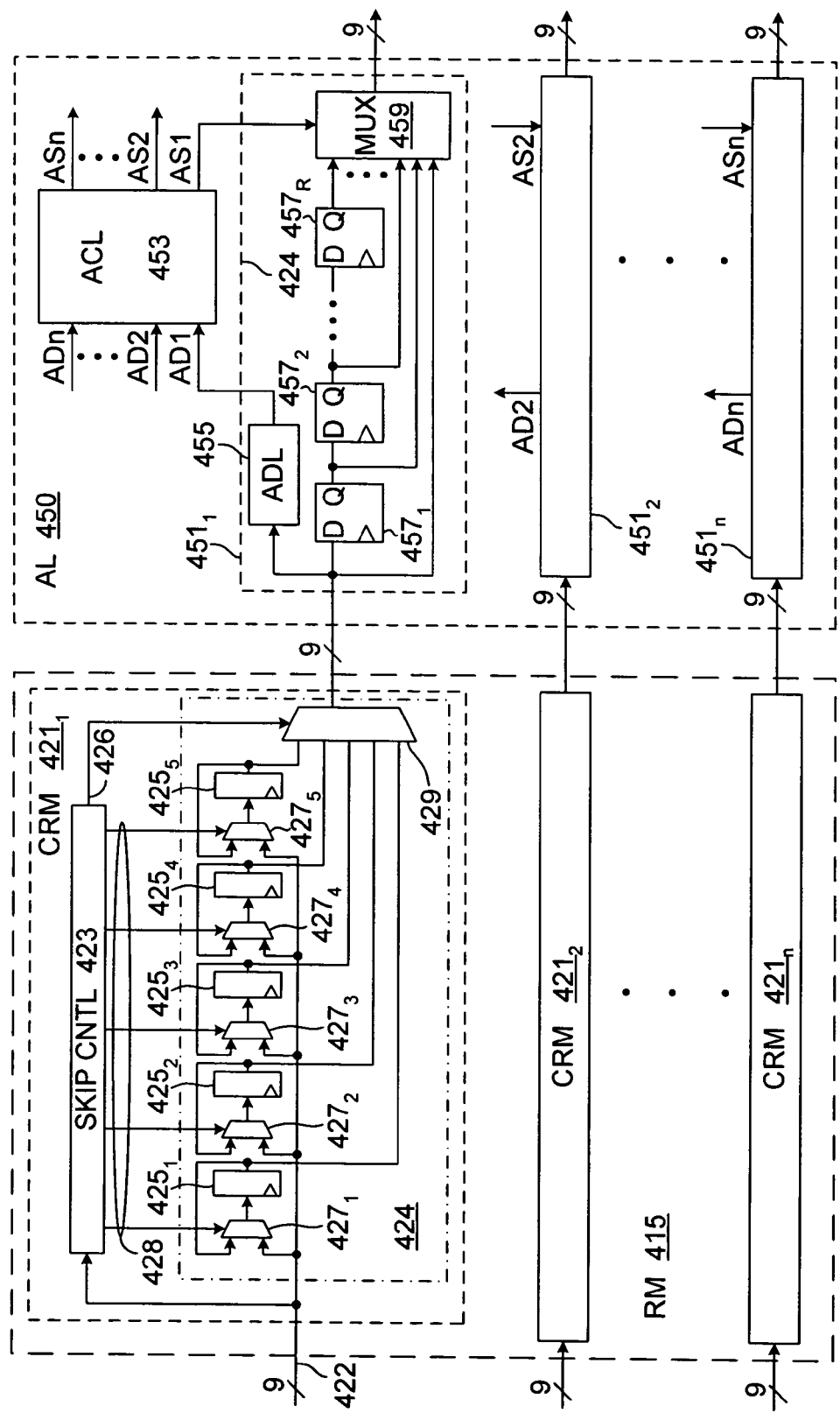
FIG. 9 illustrates embodiments of a rate matching circuit and an alignment circuit that may be used within data-path devices.

FIG. 9 illustrates embodiments of a rate matching circuit 415 and an alignment circuit 450 that may be used within the data-path devices of FIGS. 1-3. The rate matching circuit 415 includes a number of channel rate matchers $421_1$-$421_n$ (CRM), one for each data channel in the data-path device. Each channel rate matcher 421 includes a first-in-first-out buffer 424 (FIFO) and a skip control circuit 423. In the particular embodiment of FIG. 9, the FIFO 424 includes storage elements $425_1$-$425_5$ and multiplexers $427_1$-$427_5$, and is used to buffer data values and control characters received at input node 422 before they are passed on to the alignment circuit 450. The skip control circuit 423 monitors the fill-status of the FIFO 424, inserting skip characters if the FIFO 424 becomes too empty and removing (i.e., yanking) skip characters if the FIFO 424 becomes too full. In one embodiment, skip characters are inserted within a transmitted data sequence (including a test data sequence) at a frequency that ensures delivery of enough skip characters to the FIFO 424 to enable plesiochronous rate matching up to a specified frequency difference between a transmitting device and receiving device.

In the embodiment shown, the skip control circuit 423 maintains a read pointer 426 and write pointer 428 that are used to select head and tail storage elements 425 within the FIFO 424. During ordinary operation, the read pointer 426 and write pointer 428 are advanced to select progressively lower-numbered storage elements 425 in modulo fashion (i.e., under-flowing from storage element $425_1$ to $425_5$), thus forming a ring buffer. In a data output operation, multiplexer 429 passes the value output from head storage element 425 (selected by read pointer 426) to the alignment circuit 450 and the skip control circuit 423 advances the read pointer 426 to select a new head storage element. In a data load operation, the write pointer 428 enables one of multiplexers $427_1$-$427_5$ to pass the data value at node 422 to the input of corresponding storage element 425, thereby enabling the data value to be loaded into the tail storage element while all the others of the multiplexers 427 are placed in a hold state, feeding the output of the corresponding storage element 425 back to its input. After data has been loaded into the tail storage element 425, the write pointer 428 is advanced to select a new tail storage element.

In a rate mismatch condition in which the data-path device is operating more slowly than a transmitting device, the FIFO 424 will become progressively more full. The skip control circuit may detect an overfill condition (e.g., by detecting that the difference between the read and write pointers is greater than a predetermined fill threshold) and yank a skip character in response. In the embodiment of FIG. 9, for example, the skip control circuit 423 may yank a skip character by refraining from advancing the write pointer 428 after loading a skip character into the FIFO 424, thereby causing the skip character to be overwritten with a subsequently received data value.

In a reverse rate mismatch condition in which a transmitting device is operating more slowly than the data-path device, the FIFO 424 will become progressively more empty. The skip control circuit may detect an under-fill condition (e.g., by detecting that the difference between the read and write pointers is less than a predetermined fill threshold) and insert a skip character in response. In the embodiment of FIG. 9, for example, the skip control circuit may refrain from advancing the read pointer 426 after outputting a skip character, thereby causing the skip character to be output to the alignment circuit 450 again in a subsequent interval; in effect, inserting a skip character into the data stream.

In alternative embodiments, each of the channel rate matching circuits 421 may have more or fewer storage elements 425 (i.e., bigger or smaller FIFO) and thresholds used to initiate insertion and removal of skip characters may be different or established by a configuration setting (e.g., by programming one or more threshold values within the configuration circuit 170 of FIG. 2). Also, each of the channel rate matchers 421$_1$-421$_n$ may insert or yank skip characters synchronously or asynchronously with respect to each other. Other circuits for achieving plesiochronous rate matching may be used in alternative embodiments.

Still referring to FIG. 9, the alignment circuit 450 includes an alignment control circuit 453 (ACL) and a set of selectable-delay paths 451$_1$-451$_n$ (one per data channel) that are used to align values received via different port-side transceivers with one another. That is, the values received on individual port-side transceivers may be related to one another (e.g., constituent portions of a larger value) so that maintaining a predetermined temporal relationship between data sequences propagating through the different data channels may be necessary. In one embodiment, alignment characters are transmitted to each of the port-side transceivers at nominally the same time (e.g., by one or more remote devices during normal operation and by the through-core self-test circuits during loopback testing) to enable the alignment circuit 450 to delay the propagation of the earliest received alignment characters as necessary to synchronize the propagation of the alignment characters through all the data channels (or a subset thereof). In one embodiment, each of the selectable-delay paths 451 includes an alignment character detector 455 (ADL) that monitors the incoming data sequence and asserts an alignment detect signal (i.e., one of signals AD1-ADn) upon detecting an alignment character. The alignment detect signals are supplied to the alignment control circuit 453 which determines the latency between the most latent data channel (i.e., the data channel on which an alignment character is last received) and each of the less-latent data channels and outputs a set of alignment select signals (AS1 to ASn) to select an appropriately delayed instance of the data sequence in each less-latent data channel. Each of the selectable-delay paths 451 includes a sequence of buffer stages 457$_1$-457$_R$ (flip-flops in the exemplary embodiment shown) having outputs that represent progressively more delayed instances of the incoming data sequence. The output of each buffer stage 457 and the data input itself are provided to respective inputs of a multiplexer 459 to enable selection of an appropriately delayed data sequence (or no delay at all in the case of the most latent data channel) to be forwarded to the next-stage logic circuit within the data-path device. Virtually any number of buffer stages 457 may be provided within the aligner to accommodate a worst-case latency mismatch between data channels. Also, in alternative embodiments, the alignment control circuit 453 may enable alignment (e.g., in response to configuration information) of one or more subsets of data channels within the data-path device. Other logic circuits may be used to carry out an alignment function in alternative embodiments.

Figure 10:
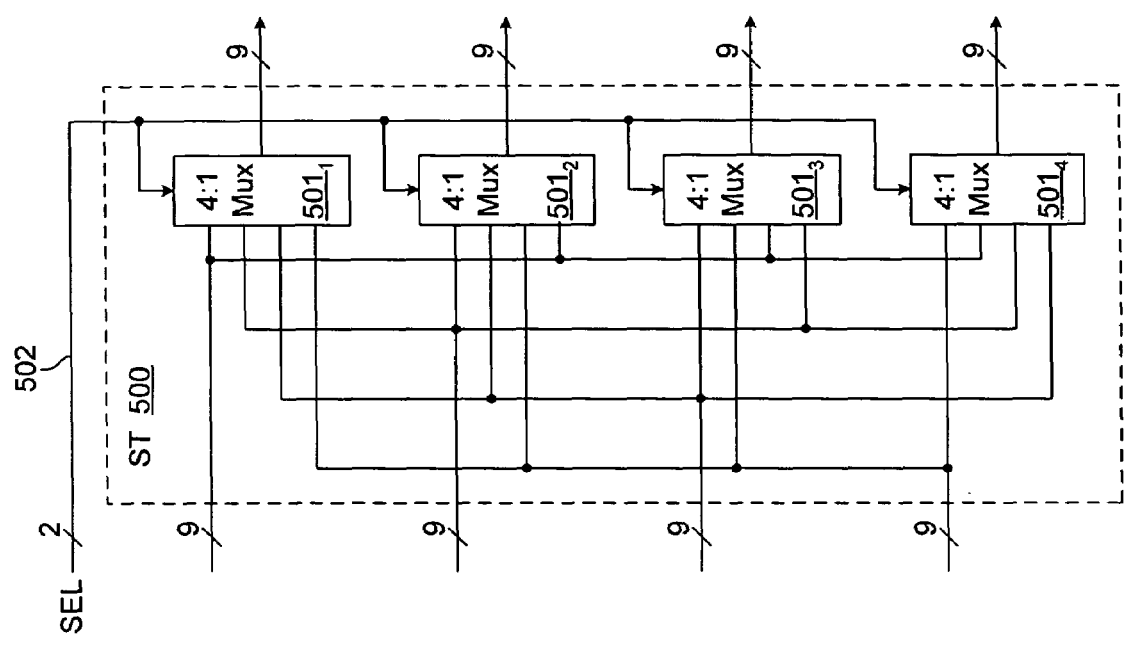
FIG. 10 illustrates an embodiment of a steering circuit that may be used within the data-path devices.

FIG. 10 illustrates an embodiment of a steering circuit 500 that may be used within the data-path device of FIGS. 1-3 to route the data sequence received on the various data channels to appropriate inputs of the control-side codec. In the particular embodiment shown, four data channels per control-side transceiver are assumed (different data channels per control-side transceiver may be used in alternative embodiments), so that a two-bit select signal 502 is used to select each of the incoming data sequences to be forwarded via a respective one of multiplexers 501$_1$-501$_4$ to a codec input. The two-bit select signal 502 may be generated in response to configuration information (e.g., a steering mode programmed within the configuration circuit 170 of FIG. 2) or dynamically in response to out-of-band information passed in one or more of the data channels (e.g., steering control characters) or any other source of select information. Also, while a port-side to control-side steering arrangement is shown, a similar steering circuit may be used to distribute the multiple N-bit values generated by the control-side transceiver to each of the data channels. For example, in one embodiment, alignment characters within the data sequence output from the control-side transceiver may be used to determine the appropriate distribution of N-bit data values to the various data channels within the data-path device (e.g., first instance of an alignment character identifies an offset within each M-bit data word of the N-bit value to be delivered to the first data channel, second instance of an alignment character identifies the offset of the N-bit value to be delivered to the second data channel and so forth).

Figure 11:
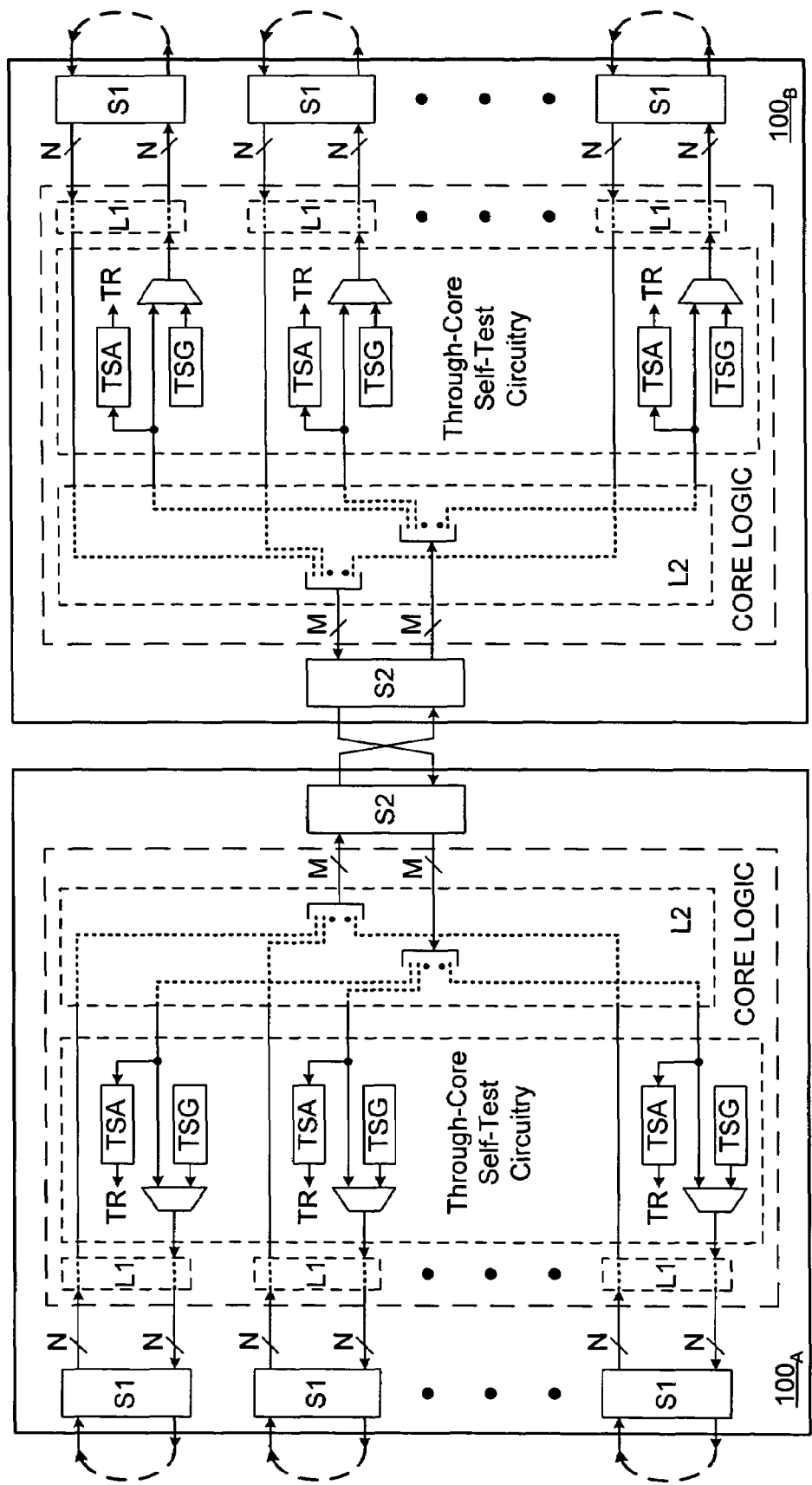
FIG. 11 illustrates a back-to-back coupled pair of data-path devices having through-core self-test circuitry according to one embodiment.

FIG. 11 illustrates a pair of data-path devices 100$_A$ and 100$_B$ having the above-described through-core self-test circuitry and coupled in a back-to-back arrangement (e.g., control-side transceivers (S2) coupled transmitter-to-receiver and vice-versa through a backplane or other interconnection structure). In such a configuration, multi-device loopback tests may be carried out simultaneously in the data channels of each data-path device 100 to exercise the transceivers and core logic within both devices. For example, by placing the through-core self-test circuitry of device 100$_A$ in a through-core loopback test mode in which only the outputs of port-side transceivers (S1) are looped back and placing the self-test circuit of device 100$_B$ in a pass-through port-side loopback mode (i.e., only the outputs of port-side transceivers (S1) are looped back, and the test sequence generator and analyzer within the self-test circuitry are bypassed) a loopback path is established between each port-side transceiver in data-path device 100$_A$ and the corresponding port-side transceiver in data-path device $100_B$, the loopback path passing through the core logic and control-side transceivers within each data-path device. Thus, a single loopback test may be carried out to confirm proper operation of the transceivers and logic circuitry in a complete round trip through the two devices. If an error is detected, the above-described loopback tests may be executed within the individual data-path devices 100 to isolate the failure to specific circuit blocks within each. Note also that the data-path devices 100A and 100B may be operated at different clock speeds, thereby enabling the rate matching logic within each device to be tested to ensure proper operation up to a tolerable clock frequency difference.

In alternative embodiments, the two data-path devices $100_A$ and $100_B$ may be coupled via one or more port-side transceiver interconnections (i.e., a front-side interconnect, S1 to S1), with loopbacks established at the control-side transceivers (S2) to enable multi-device loopback testing. In yet other embodiments more than two devices may be daisy chained via alternating back-to-back and front-to-front interconnections to enable a chain of data-path devices to be tested in a single through-core loopback test.

Although through-core loopback testing has been described in the context of a data-path device, such through-core loopback test circuitry and methodology may be applied in virtually any integrated circuit device or portion thereof including, without limitation, a memory controller, bus bridge, input/output controller or any other device having two or more transceivers.

It should be noted that the various circuits disclosed herein may be described using computer aided design tools and expressed or represented, as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Although the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated circuit device comprising:
    a first test sequence generator to generate a first sequence of test data values;
    a first transceiver coupled to receive the first sequence of test data values and configurable in a loopback arrangement to transmit a first test signal representative of the first sequence of test data values and to generate a sequence of samples of the first test signal;
    a second transceiver coupled to receive the sequence of samples of the first test signal and configurable in a loopback arrangement to transmit a second test signal representative of the sequence of samples of the first test signal and to generate a sequence of samples of the second test signal; and
    a first test sequence analyzer coupled to receive the sequence of samples of the second test signal and configured to determine whether the sequence of samples of the second test sequence meet a pattern that is based on the first sequence of test data values.

2. The integrated circuit device of claim 1 wherein the first and second transceivers are configured to transmit the first and second test signals at unequal first and second signaling rates, respectively.

3. The integrated circuit device of claim 2 wherein the second signaling rate is an integer multiple of the first signaling rate.

4. The integrated circuit device of claim 1 further comprising:
    a second test sequence generator to generate a second sequence of test data values;
    a third transceiver coupled to receive the second sequence of test data values and configurable in a loopback arrangement to transmit a third test signal representative of the second sequence of test data values and to generate a sequence of samples of the third test signal;
    wherein the second transceiver is coupled to receive the sequence of samples of the third test signal and is configurable in the loopback arrangement to transmit a fourth test signal representative of the sequence of samples of the third test signal and to generate a sequence of samples of the fourth test signal; and
    a second test sequence analyzer coupled to receive the sequence of samples of the fourth test signal and configured to compare the sequence of samples of the fourth test signal with the second sequence of test data values.

5. The integrated circuit device of claim 4 wherein the second transceiver is configured to transmit the second and fourth test signals in a time-division-multiplexed manner.

6. The integrated circuit device of claim 1 wherein the first test sequence analyzer is additionally coupled to receive the first sequence of test data values from the first test sequence generator.

7. The integrated circuit device of claim 1 wherein the first test sequence analyzer comprises a second test sequence generator to generate a duplicate instance of the first sequence of data values.

8. An integrated circuit device comprising:
a test sequence generator to generate a test data sequence;
a first transceiver coupled to receive the test data sequence from the test sequence generator and configurable in a loopback mode to transmit and receive the test data sequence;
a second transceiver coupled to receive the test data sequence from the first transceiver and configurable in a loopback mode to transmit and receive the test data sequence; and
a test sequence analyzer to determine whether the test data sequence received by the second transceiver matches the test data sequence generated by the test sequence generator.

9. The integrated circuit device of claim 8 wherein the test data sequence generated by the test sequence generator comprises a plurality of multi-bit values, and wherein the first transceiver comprises serializing transmit circuitry to output each one of the multi-bit values as a serial stream of symbols, each symbol corresponding to a respective subset of bits of the one of the multi-bit values.

10. The integrated circuit device of claim 9 wherein each respective subset of bits comprises a single bit of the multi-bit value.

11. The integrated circuit device of claim 9 wherein the first transceiver comprises deserializing receive circuitry to sample the serial stream of symbols and to generate a received multi-bit value that corresponds to the one of the multi-bit values, the received multi-bit value constituting a test data value within the test data sequence received by the first transceiver.

12. The integrated circuit device of claim 8 wherein the test sequence generator is configured to generate a test data sequence that includes a pseudo-random sequence of data values having control values dispersed therein, the test data sequence including at least one control value for each N data values of the pseudo random sequence of data values.

13. The integrated circuit device of claim 8 wherein the test sequence generator is configured to output a test data sequence having a predetermined bit pattern.

14. The integrated circuit device of claim 8 wherein the test sequence generator is configured to output an algorithmically generated test data sequence.

15. The integrated circuit device of claim 8 wherein the test sequence generator comprises:
a pseudo-random sequence generator to generate a pseudo-random sequence of data values; and
a select circuit having a first input coupled to receive the pseudo-random sequence of data values and a second input to coupled to receive a control value, the select circuit being responsive to a control signal to alternately output the pseudo-random sequence of data values and the control value.

16. The integrated circuit device of claim 15 wherein the test sequence generator comprises a control circuit to assert and deassert the control signal at least once every N cycles of a clock signal, the select circuit being configured to output a data value of the pseudo-random sequence of data values during each of the clock signal in which the control signal is deasserted and to output the control value during each cycle of the clock signal in which the control signal is asserted.

17. A method of testing an integrated circuit device, the method comprising:
generating a first sequence of test data values;
transmitting a first test signal that corresponds to the first sequence of test data values;
sampling the first test signal to generate a second sequence of test data values;
transmitting a second test signal that corresponds to the second sequence of test data values;
sampling the second test signal to generate a third sequence of test data values; and
comparing the third sequence of test data values with the first sequence of test data values.

18. The method of claim 17 wherein generating the first sequence of test data values comprises generating a pseudo-random sequence of test data values interspersed with control values.

19. The method of claim 17 further comprising:
generating a fourth sequence of test data values;
transmitting a fourth test signal that corresponds to the fourth sequence of test data values;
sampling the fourth test signal to generate a fifth sequence of test data values; and
transmitting the fifth sequence of test data values in the second test signal along with the second sequence of test data values.

20. The method of claim 19 wherein transmitting and sampling the first, second and fourth test signals comprises transmitting and sampling the first, second and fourth test signals in first, second and third transceiver circuits, respectively.

21. The method of claim 17 wherein transmitting the first test signal comprises transmitting the first test signal at a first signaling rate and wherein transmitting the second test signal comprises transmitting the second test signal at a second signaling rate that is a frequency multiple of the first signaling rate.

22. The method of claim 17 wherein comparing the third sequence of test data values with the first sequence of test data values comprises generating a second instance of the first sequence of data values.

23. The method of claim 17 further comprising asserting an error signal if the first and third sequences of test data values do not match.

24. Computer-readable media having information embodied therein that constitutes a representation of an apparatus comprising:
a test sequence generator configured to generate a test data sequence;
a first transceiver coupled to receive the test data sequence from the test sequence generator and configurable in a loopback mode to transmit and receive the test data sequence;
a second transceiver coupled to receive the test data sequence from the first transceiver and configurable in a loopback mode to transmit and receive the test data sequence; and
a test sequence analyzer to determine whether the test data sequence received by the second transceiver matches the test data sequence generated by the test sequence generator.

25. The computer-readable media of claim 24 wherein the test sequence generator represented by the information embodied in the computer-readable media is further configured to generate a test data sequence that includes a pseudo-random sequence of data values having control values dispersed therein, the test data sequence including at least one control value for each N data values of the pseudo random sequence of data values.

26. The computer-readable media of claim 24 wherein the test sequence generator represented by the information embodied in the computer-readable media comprises:

a pseudo-random sequence generator to generate a pseudo-random sequence of data values; and a select circuit having a first input coupled to receive the pseudo-random sequence of data values and a second input to coupled to receive a control value, the select circuit being responsive to a control signal to alternately output the pseudo-random sequence of data values and the control value.

27. An integrated circuit device comprising:

means for generating a first sequence of test data values;

means for transmitting a first test signal that corresponds to the first sequence of test data values;

means for sampling the first test signal to generate a second sequence of test data values;

means for transmitting a second test signal that corresponds to the second sequence of test data values;

means for sampling the second test signal to generate a third sequence of test data values; and means for comparing the third sequence of test data values with the first sequence of test data values.

* * * * *